(12) United States Patent
Hou et al.

(10) Patent No.: US 11,538,761 B2
(45) Date of Patent: Dec. 27, 2022

(54) SEMICONDUCTOR PACKAGE HAVING MOLDED DIE AND SEMICONDUCTOR DIE AND MANUFACTURING METHOD THEREOF

(71) Applicant: Taiwan Semiconductor Manufacturing Company, Ltd., Hsinchu (TW)

(72) Inventors: Hao-Cheng Hou, Hsinchu (TW); Wei-Yu Chen, Hsinchu (TW); Jung-Wei Cheng, Hsinchu (TW); Tsung-Ding Wang, Tainan (TW); Chien-Hsun Lee, Hsin-chu County (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/144,061

(22) Filed: Jan. 7, 2021

(65) Prior Publication Data

US 2022/0216153 A1 Jul. 7, 2022

(51) Int. Cl.
| | |
|---|---|
| *H01L 23/538* | (2006.01) |
| *H01L 23/00* | (2006.01) |
| *H01L 23/31* | (2006.01) |
| *H01L 21/56* | (2006.01) |
| *H01L 25/18* | (2006.01) |

(52) U.S. Cl.
CPC ........ *H01L 23/5383* (2013.01); *H01L 21/561* (2013.01); *H01L 21/565* (2013.01); *H01L 23/3135* (2013.01); *H01L 24/11* (2013.01); *H01L 24/16* (2013.01); *H01L 24/19* (2013.01); *H01L 24/24* (2013.01); *H01L 24/73* (2013.01); *H01L 24/81* (2013.01); *H01L 25/18* (2013.01); *H01L 2224/16155* (2013.01); *H01L 2224/16503* (2013.01); *H01L 2224/24137* (2013.01); *H01L 2224/73209* (2013.01); *H01L 2224/81815* (2013.01)

(58) Field of Classification Search
CPC ..... H01L 23/3135; H01L 24/16; H01L 24/81; H01L 2224/24137; H01L 2224/023; H01L 21/565; H01L 25/042; H01L 25/043; H01L 25/0657; H01L 25/0756; H01L 24/11; H01L 24/19; H01L 24/24; H01L 24/73
USPC ....................................................... 257/773
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Khiem D Nguyen
(74) *Attorney, Agent, or Firm* — JCIPRNET

(57) ABSTRACT

A semiconductor package includes a first semiconductor die, a molded die, a third encapsulant, and a redistribution structure. The molded die includes a chip, a first encapsulant, and a second encapsulant. The first encapsulant laterally wraps the chip. The second encapsulant laterally wraps the first encapsulant. The third encapsulant laterally wraps the first semiconductor die and the molded die. The redistribution structure extends on the second encapsulant, the third encapsulant, and the first semiconductor die. The redistribution structure is electrically connected to the first semiconductor die and the molded die. The second encapsulant separates the first encapsulant from the third encapsulant.

20 Claims, 27 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,217,719 B2 * | 2/2019 | Watanabe ............... H01L 24/19 |
| 10,535,632 B2 * | 1/2020 | Jeng ........................ H01L 24/17 |
| 2019/0148340 A1 * | 5/2019 | Yu ........................ H01L 21/565 257/737 |
| 2020/0020640 A1 * | 1/2020 | Wu ........................ H01L 24/20 |
| 2020/0075546 A1 * | 3/2020 | Shih ................. H01L 23/49822 |
| 2020/0135694 A1 * | 4/2020 | Hung .................... H01L 21/486 |
| 2021/0305226 A1 * | 9/2021 | Tsai ........................ H01L 25/16 |

* cited by examiner

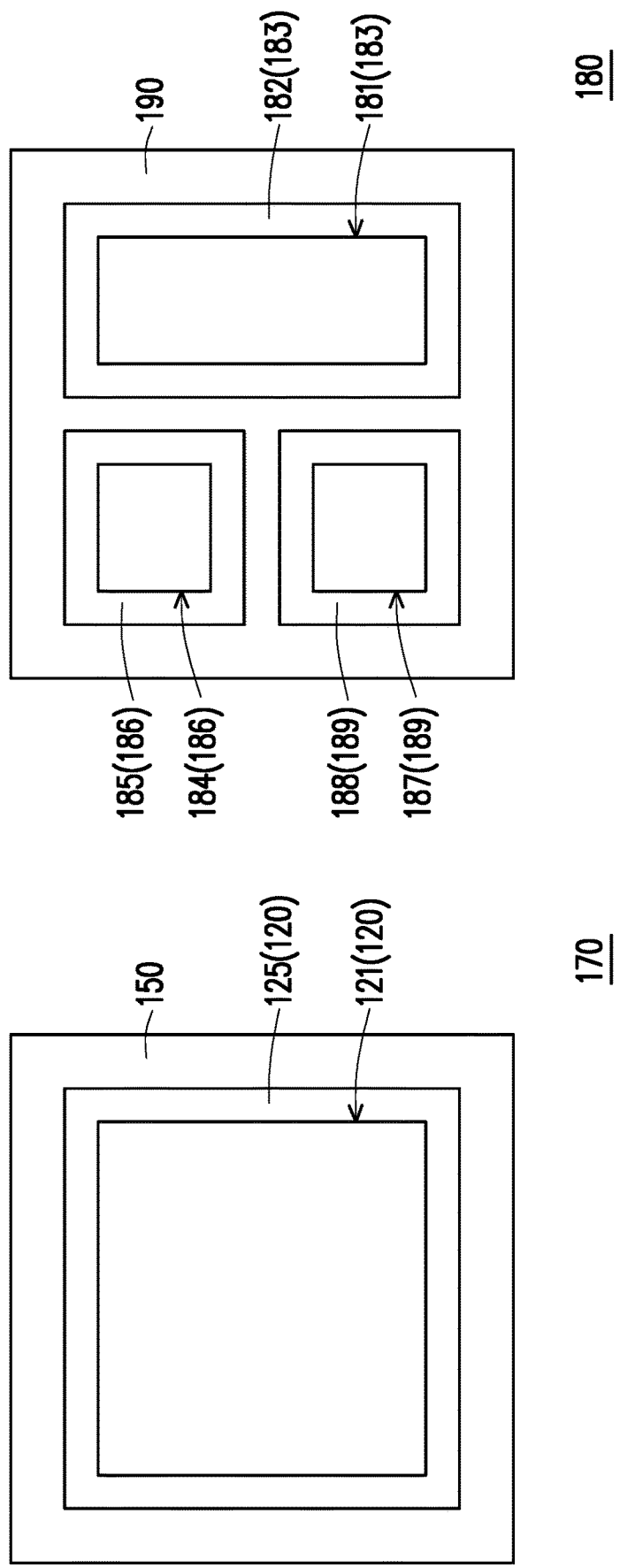

SEMICONDUCTOR PACKAGE HAVING MOLDED DIE AND SEMICONDUCTOR DIE AND MANUFACTURING METHOD THEREOF

BACKGROUND

Semiconductor devices and integrated circuits used in a variety of electronic applications, such as cell phones and other mobile electronic equipment, are typically manufactured from a single semiconductor wafer. The dies of the wafer may be processed and packaged with other semiconductor devices or dies at the wafer level, and various technologies have been developed for wafer level packaging. As electronic products are continuously miniaturized, heat dissipation of the packaged semiconductor dies has become an important issue for packaging technology. In addition, for multi-die packages, the arrangement of the dies and the corresponding connecting elements affects data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A and FIG. 2B show schematic top views of molded dies according to some embodiments of the present disclosure.

DESCRIPTION OF THE EMBODIMENTS

Figure 1A:
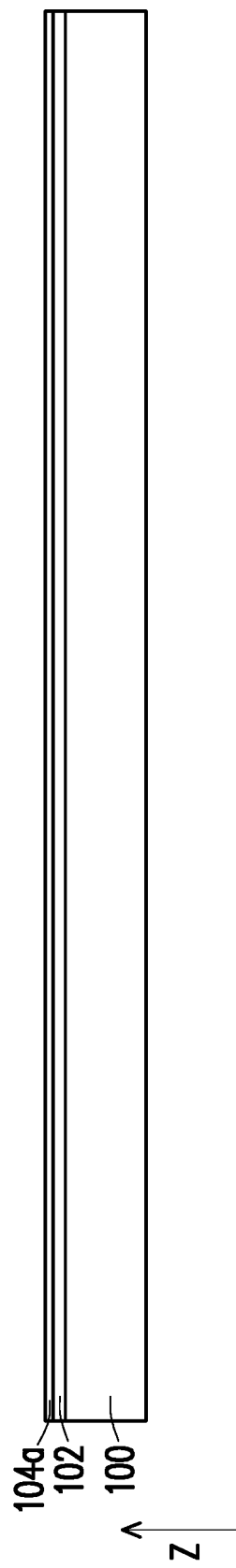
FIG. 1A through FIG. 1G show schematic cross-sectional views of structures produced at various stages of a manufacturing method of molded dies according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G show schematic cross-sectional views illustrating structures produced at various stages of a manufacturing method of molded dies 170 according to some embodiments of the disclosure. Referring to FIG. 1A, a carrier 100 having a de-bonding layer 102 formed thereon is provided. In some embodiments, the carrier 100 is a glass substrate, a metal plate, a plastic supporting board or the like, but other suitable substrate materials may be used as long as the materials are able to withstand the subsequent steps of the process. In some embodiments, the de-bonding layer 102 includes a light-to-heat conversion (LTHC) release layer, which facilitates peeling the carrier 100 away when required by the manufacturing process.

In FIG. 1A, a seed material layer 104a is blanketly formed over the carrier 100, for example, on the de-bonding layer 102, if included. The seed material layer 104a may be formed through a sputtering process, a physical vapor deposition (PVD) process, or the like. In some embodiments, the seed material layer 104a includes, for example, copper, tantalum, titanium, a combination thereof, or other suitable materials.

Figure 1B:
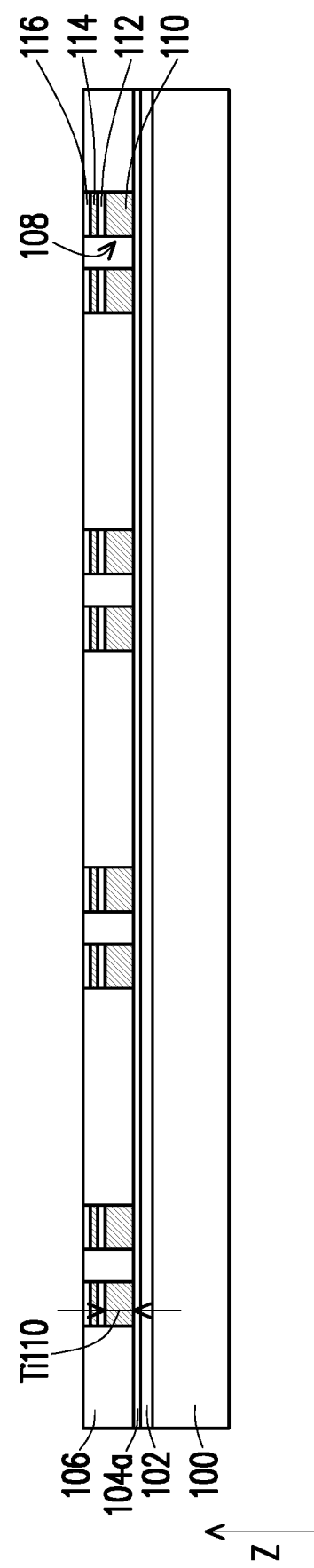

In FIG. 1B, an auxiliary mask 106 is formed on the seed material layer 104a. The auxiliary mask 106 may be patterned to include openings 108 exposing the seed material layer 104a at their bottom. In some embodiments, the auxiliary mask 106 includes a positive or negative photoresist. In some embodiments, the auxiliary mask 106 is formed by deposition, exposure and development of a photoresist material.

In some embodiments, one or more metallic materials are sequentially formed within the openings 108 of the auxiliary mask 106, for example via a series of plating steps. The plating steps may be, for example, electro-plating, electroless-plating, immersion plating, or the like. For example, metal posts 110 may be formed by disposing a metal material in the openings 108. In some embodiments, the metal material of the metal posts 110 may include cobalt (Co), tungsten (W), copper (Cu), titanium (Ti), tantalum (Ta), aluminum (Al), zirconium (Zr), hafnium (Hf), a combination thereof, or other suitable metallic materials. For example, the metal posts 110 may include copper.

One or more additional metal layers may then be formed on the metal posts 110. For example, a metal layer 112, a metal layer 114, and a metal layer 116 may be formed on the metal posts 110. The metal layers 112, 114, 116 may include different materials with respect to each other. For example, each one of the metal layers 112, 114, 116 may independently include one or more metallic materials, such as copper, nickel, tin, palladium, gold, titanium, aluminum, tungsten, or alloys thereof. For example, the metal layer 112 disposed directly on the metal posts 110 may include nickel, the metal layer 114 stacked on the metal layer 112 may include copper, and the metal layer 116 disposed on the metal layer 114 may include tin. However, the disclosure is not limited thereto, and other combinations of materials are possible and contemplated within the scope of the disclosure.

Figure 1C:
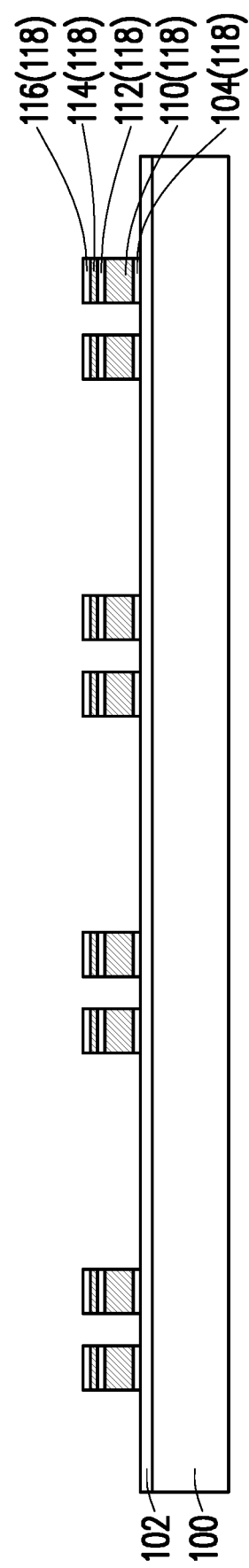

Referring to FIG. 1B and FIG. 1C, the auxiliary mask 106 and the portions of the seed material layer 104a underlying the auxiliary mask 106 may be removed, leaving micro-bumps 118 over the carrier 100. In some embodiments, the auxiliary mask 106 may be removed according to any suitable process, for example via ashing or stripping. The portions of the seed material layer 104a underlying the auxiliary mask 106 may also be removed, for example via selective etching. Seed layers 104 may remain underneath corresponding metal posts 110 in the micro-bumps 118.

Figure 1D:
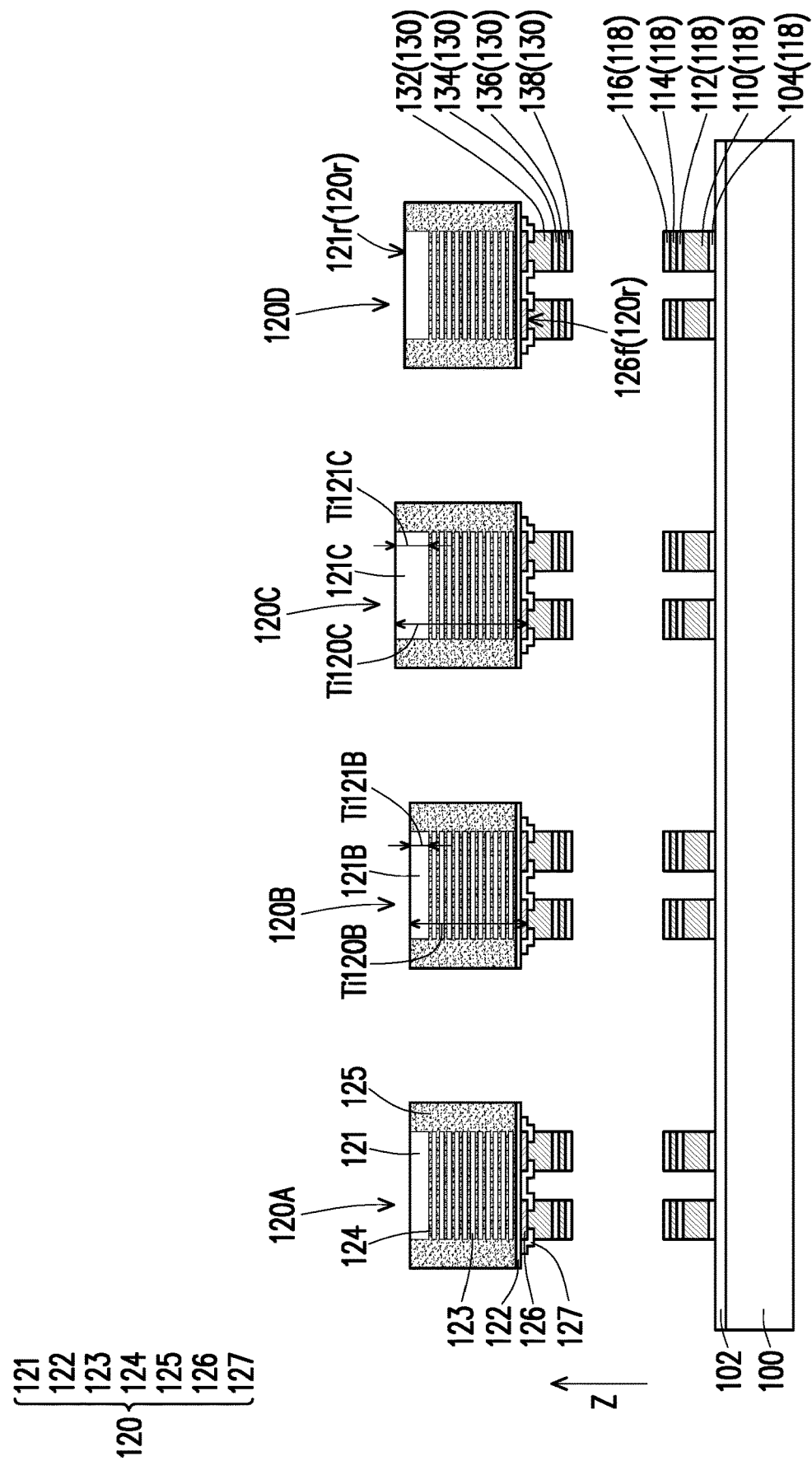

In FIG. 1D, semiconductor dies 120A-120D are picked and placed over the carrier 100, in correspondence of the micro-bumps 118. In FIG. 1D are illustrated four semiconductor dies 120A-120D, but, of course, the disclosure is not limited by the number of semiconductor dies 120A-120D disposed over the carrier 100. In the rest of the disclosure, the labels "A"-"D" may be dropped from the reference signs when referring to a group of same or similar elements collectively, without addressing the elements of the group individually. So, for example, the semiconductor dies 120A-120D may be collectively referred to as semiconductor dies 120, and so on.

A semiconductor die 120 may include a top chip 121, a base chip 122, and chips 123 stacked in between the top chip 121 and the base chip 122. The chips 123 may be connected to each other, to the top chip 121, and to the base chip 122 by mini-bumps 124. The chips 121, 122, 123 may include semiconductor substrates having active and/or passive devices formed therein. An encapsulant 125 may laterally wrap the chips 121, 122, 123 and the mini-bumps 124. A material of the encapsulant 125 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. Conductive pads 126 may be formed on the base chip 122, at an opposite side of the base chip 122 with respect to the stacked chips 123 and the top chip 121. A protection layer 127 may be formed on the base chip 122 on the same side of the conductive pads 126. The protection layer 127 may partially cover the conductive pads 126, while including openings exposing at least a portion of the conductive pads 126. As such, the conductive pads 126 are available to allow electrical connection to the chips 121, 122, 123 of the semiconductor die 120.

While a certain structure of the semiconductor dies 120 is illustrated in the drawings and described above, the disclosure is not limited thereto, and other structures (e.g., single chip dies, InFO, chip stacks, and so on) are contemplated in the disclosure. Furthermore, the semiconductor dies 120 do not need to have similar structures to each other, so that some semiconductor dies 120 may be InFO dies, some may be single chip dies, and so on. Similarly, the disclosure does not limit the function for which the semiconductor dies 120 may be configured. For example, the semiconductor dies 120 may be memory dies, such as high-bandwidth memories; logic dies, such as a central processing unit (CPU) die, a graphic processing unit (GPU) die, a micro control unit (MCU) die, an input-output (I/O) die, a baseband (BB) die, or an application processor (AP) die; microelectromechanical systems, such as sensors or the like; chiplets, and so on.

In some embodiments, the semiconductor dies 120, even when having similar structures with respect to each other, may present similar but not identical dimensions. For example, the semiconductor dies 120 may all be the same type of dies, for example including the same number of chips 123 stacked between the base chip 122 and the top chip 121, but still have different initial thicknesses Ti120. For example, the thickness Ti120B of the semiconductor die 120B may be smaller than the thickness Ti120C of the semiconductor die 120C. The thicknesses Ti120B and Ti120C may be measured along the Z direction, from the rear surfaces 121r of the top chips 121B, 121C to the front surfaces 126f of the corresponding conductive pads 126B, 126C. The front surfaces 126f are the surfaces of the conductive pads 126 in contact with the metal post 132 of the micro-bump 130 described below. In some embodiments, the difference in thickness Ti120 between the semiconductor dies 120 may be up to about 5% of the average thickness Ti120 of the semiconductor dies 120. For example, the average thickness of the semiconductor dies 120 may be about between 680 to 760 micrometers, for example, 720 or 730 micrometers, with most of the individual thicknesses Ti120 being up to about 25 micrometers larger or smaller than the average thickness. In some embodiments, the difference between the thicknesses Ti120B and Ti120C may be a consequence of the manufacturing process of the semiconductor dies 120, or may derive from dimensional variations of the components of the semiconductor dies 120. For example, the top chip 121C of the semiconductor die 120C may have a thickness Ti121C along the Z direction larger than the thickness Ti121B along the Z direction of the top chip 121B of the semiconductor die 120B, resulting in the initial thickness Ti120C being greater than the initial thickness Ti120B. In some cases, differences in thicknesses Ti120B, Ti120C may be originated or accentuated by non-uniform thicknesses of the stacked chips 123 or of the base chips 122, for example.

In some embodiments, micro-bumps 130 are formed on the conductive pads 126 of the semiconductor dies 120. The structure of the micro-bumps 130 may be similar to the structure of the micro-bumps 118. For example, the micro-bumps 130 may include a metal post 132 including a first metallic material, and, optionally, one or more metal layers 134, 136, 138 stacked on the metal post 132. Materials of the micro-bumps 130 may be similar to the ones previously described for the micro-bumps 118. For example, the metal post 132 may include cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the metal post 132 includes copper. Each one of the metal layers 134, 136, 138 may independently include one or more metallic materials, such as copper, nickel, tin, palladium, gold, titanium, aluminum, tungsten, or alloys thereof. For example, the metal layer 134 disposed directly on the metal posts 132 may include nickel, the metal layer 136 stacked on the metal layer 134 may include copper, and the metal layer 138 disposed on the metal layer 136 may include tin. However, the disclosure is not limited thereto, and other combinations of materials are possible and contemplated within the scope of the disclosure.

In some embodiments, the semiconductor dies 120 are picked-and-placed over the carrier 100 with the micro-bumps 130 aligned with respect to the micro-bumps 118. The semiconductor dies 120 may be oriented with the conductive pads 126 and the micro-bumps 130 directed towards the micro-bumps 118, so that the metal layers 138 overlap with the metal layers 116 when the semiconductor dies 120 are disposed over the carrier 100.

Figure 1E:
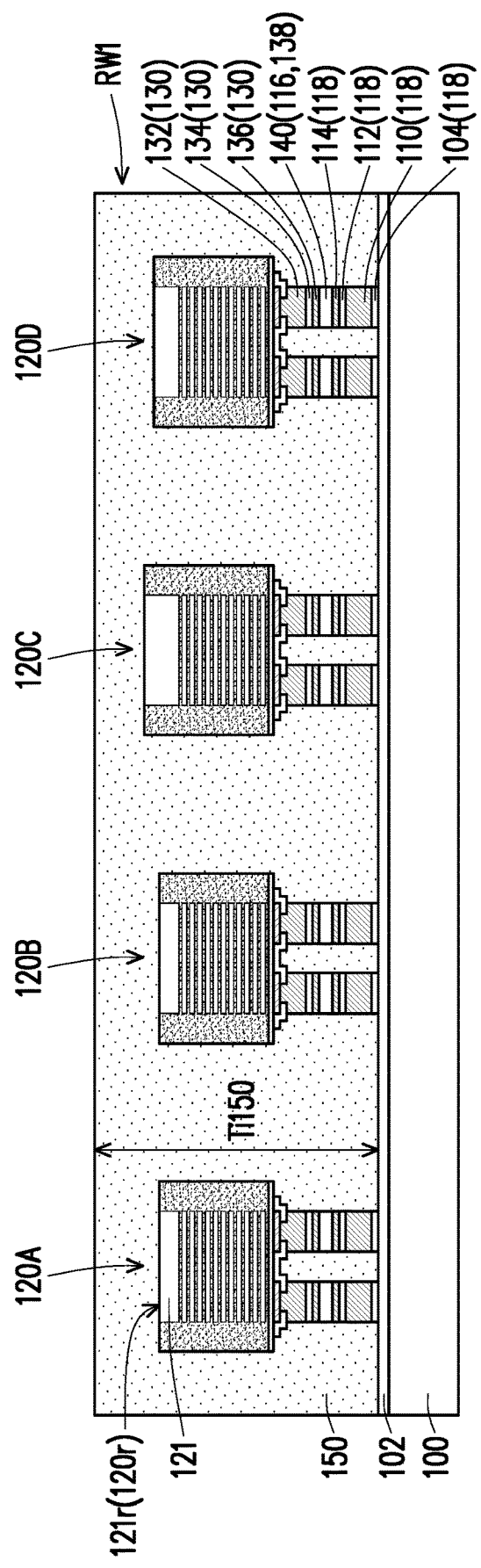

Referring to FIG. 1D and FIG. 1E, in some embodiments the semiconductor dies 120 are bonded to the micro-bumps 118 via the micro-bumps 130. For example, a reflow process may be performed to join the metal layers 138 to the metal layers 116, thereby forming joint metal layers 140. The reflow temperature and the processing time of the reflow process may be optimized depending on the composition of the metal layers 116, 138 to be joined. In some embodiments, intermetallic compounds or an intermetallic layer is formed in the joint metal layer 140 by reflowing and joining together the two metal layers 138, 116. In some embodiments, the metal layers 134, 136, 112, 114 adjacent to the metal layers 116, 138 to be joined may be consumed, partially or completely, during the reflow process. In some embodiments, the reflow process may at least partially correct misalignment of the semiconductor dies 120 with respect to the micro-bumps 118 formed over the carrier 100.

In some embodiments, after the semiconductor dies 120 are bonded to the micro-bumps 118, an encapsulant 150 is formed over the carrier 100 to encapsulate the semiconductor dies 120 and the joint micro-bumps 118, 130. In some embodiments, the encapsulant 150 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant 150 is formed by a molding process, such as a compression molding process, or the like. In some embodiments, the encapsulant 150 may include an organic polymer and fillers. The fillers may be selected to be sufficiently small so as to allow the encapsulant 150 to seep in the space between the semiconductor dies 120 and the carrier 100, in the interstices defined by the joint micro-bumps 118, 130. For example, a particle size of the fillers of the encapsulant 150 may be about in the range from 1 micrometer to 25 micrometers (e.g., measured along the longest dimension, such as a diameter, etc.). In some embodiments, the fillers may include carbon-based materials, inorganic materials (such as silica, ceramic materials, etc.), a combination thereof, or the like. In some embodiments, the encapsulant 150 may be formed with an initial thickness Ti150 sufficiently large to bury the rear surfaces 120r of the semiconductor dies 120. With the formation of the encapsulant 150, the semiconductor dies 120 are molded together in a reconstructed wafer RW1.

Figure 1F:
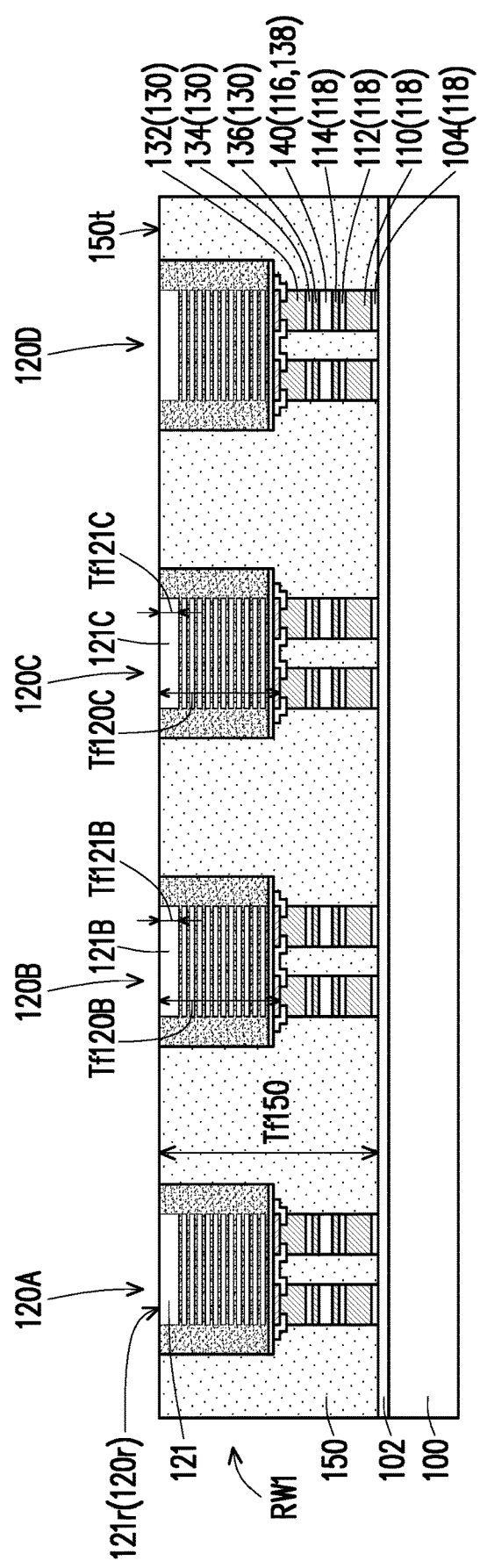

Referring to FIG. 1E and FIG. 1F, in some embodiments, portions of the encapsulant 150 and, possibly, of the semiconductor dies 120 are removed, until the rear surfaces 120r of the semiconductor dies 120 and the top surface 150t of the encapsulant 150 become substantially coplanar. That is, the encapsulant 150 is thinned down from the initial thickness Ti150 to the final thickness Tf150, and the semiconductor dies 120 are thinned down from the initial thicknesses Ti120 to the final thicknesses Tf120. In some embodiments, thinning the semiconductor dies 120 includes reducing the thicknesses of the top chips 121 from the initial thicknesses Ti121 to the final thickness Tf120, by removing material from the side of the rear surfaces 121r, as well as removing portions of the encapsulant 125. In some embodiments, the amount of material removed from the top chips 121 varies depending on the initial thickness Ti121 of the top chip 121. For example, more material may be removed from the thicker top chip 121C than from the thinner top chip 121B. In some embodiments, the encapsulant 150 is thinned during a planarization process, such as grinding, chemical-mechanical polishing or the like.

Figure 1G:
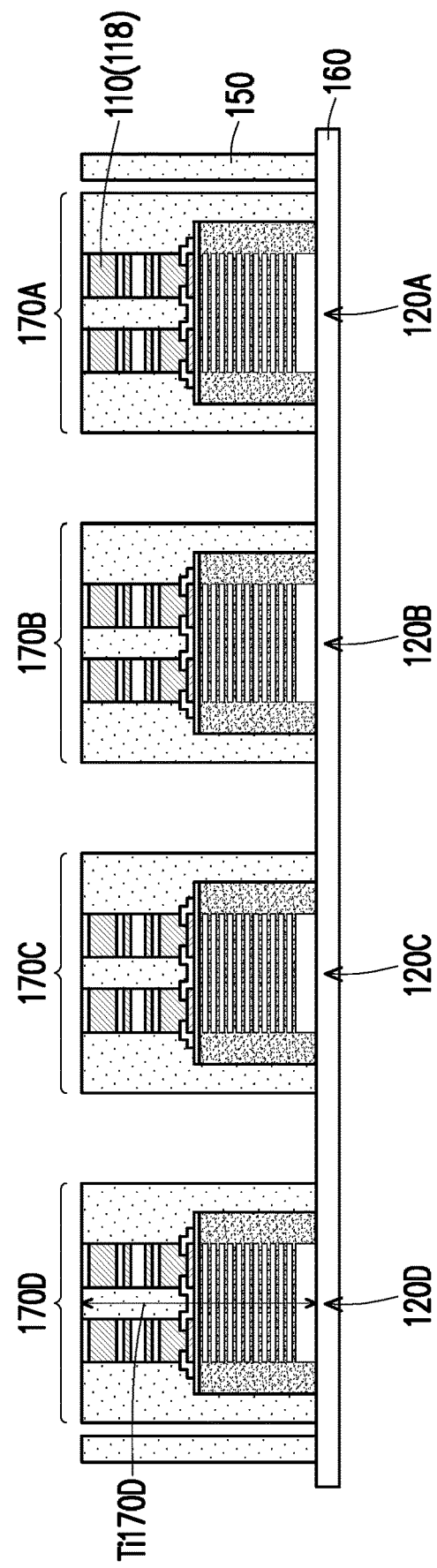

Referring to FIG. 1F and FIG. 1G, the reconstructed wafer RW1 is overturned over a supporting frame 160 to continue the manufacturing process. The reconstructed wafer RW1 is disposed on the supporting frame 160 with the top chips 121 of the semiconductor dies 120 directed towards the supporting frame 160. In some embodiments, the de-bonding layer 102 (e.g., the LTHC release layer) is irradiated with radiation of appropriate wavelength, so that the carrier 100 and the de-bonding layer 102 are easily peeled off from the reconstructed wafer RW1. Nevertheless, the de-bonding process is not limited thereto, and other suitable de-bonding methods may be used in some alternative embodiments. Removal of the carrier C from the reconstructed wafer RW exposes the encapsulant 150 and the seed layers 104 (if included) or the metal posts 110 of the micro-bumps 118. Thereafter, the reconstructed wafer RW1 may be singulated to separate the individual semiconductor dies 120 in a plurality of molded dies 170. In some embodiments, the thickness Ti170 of the molded dies 170 corresponds to the thickness Tf150 of the encapsulant 150 after planarization. In some embodiments, the molded dies 170 have a narrower distribution of thicknesses Ti170 than the distribution of thickness Ti120 of the semiconductor dies 120. For example, the distribution of the thicknesses Ti170 may be up to about 60% narrower than the distribution of thicknesses Ti120. As a way of example and not of limitation, if the distribution of the thicknesses has a width of about ±25 micrometers, the distribution of thicknesses Ti170 may have a width of about ±10 micrometers. That is, by fixing the semiconductor dies 120 on the carrier, molding the semiconductor dies 120 in an encapsulant 150 and performing a planarization process, molded dies 170 of substantially uniform thickness Ti170 may be obtained.

FIG. 2A and FIG. 2B are schematic top views of molded dies 170, 180 according to some embodiments of the disclosure. In some embodiments, the molded die 170 of FIG. 2A includes a single semiconductor die 120, with the encapsulant 125 surrounding the top chip 121 (and the other chips 122, 123, illustrated, e.g., in FIG. 1D), and the encapsulant 150 surrounding the encapsulant 125. However, the disclosure is not limited thereto. In some alternative embodiments, a molded die such as the molded die 180 of FIG. 2B may include multiple semiconductor dies 183, 186, 189 molded in the encapsulant 190. The semiconductor dies 183, 186, 189 may independently have similar structures to the ones described above for the semiconductor dies 120. For example, the semiconductor dies 183, 186, 189 may include stacked chips (of which the top chips 181, 184, 187 are illustrated in FIG. 2B) surrounded by the encapsulants 182, 185, or 188. Within the molded dies 180, the semiconductor dies 183, 186, 189 may be electrically insulated from each other, as the corresponding micro-bumps (not illustrated)

may be exposed at the opposite side of the encapsulant 190 (as illustrated for the micro-bumps 118 in FIG. 1G, for example).

Figure 3A:
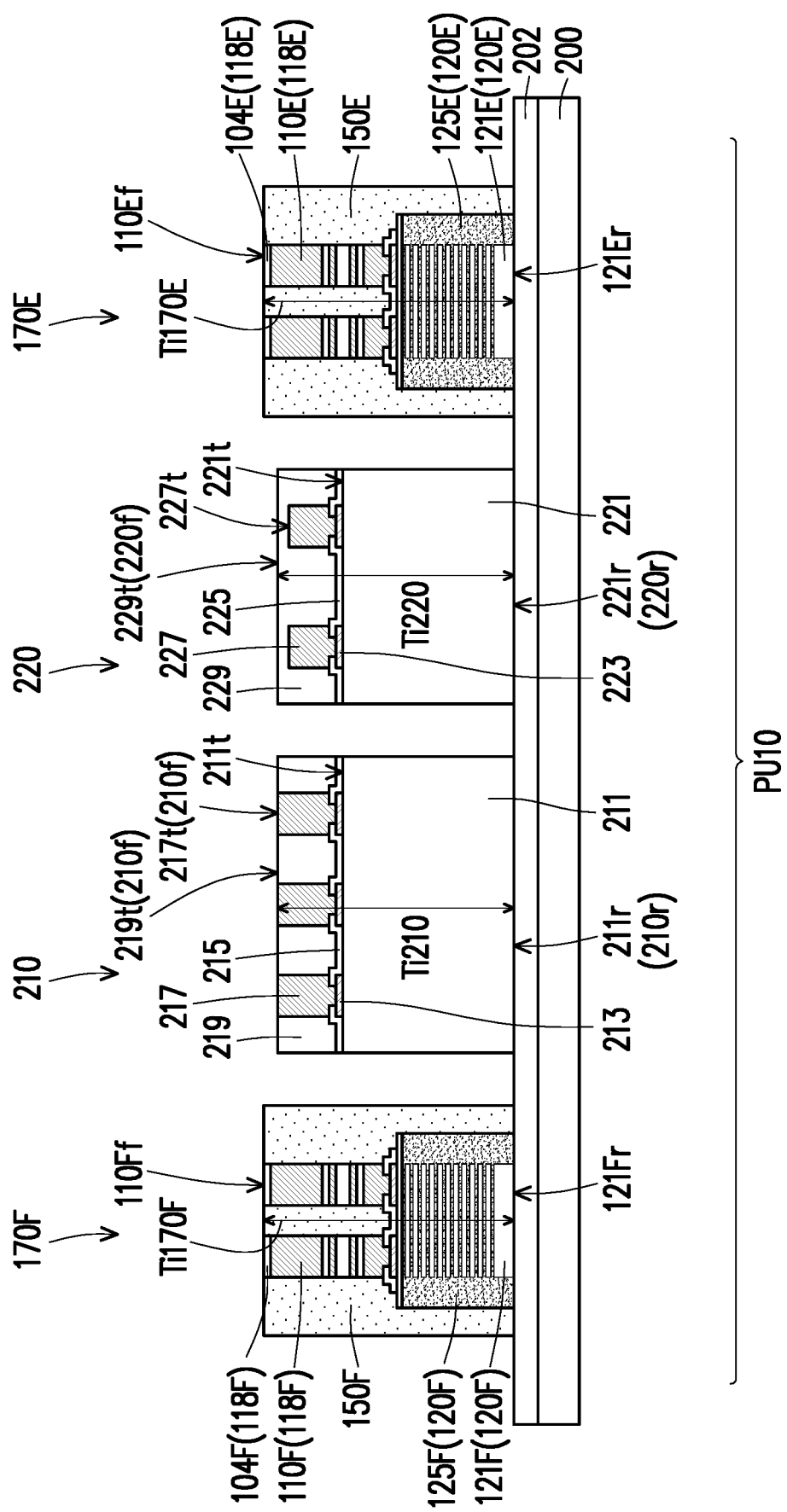
FIG. 3A to FIG. 3E show schematic cross-sectional views of structures produced at various stage of a manufacturing method of a semiconductor package according to some embodiments of the disclosure.

FIG. 3A to FIG. 3E are schematic cross-sectional views of structures formed during a manufacturing method of a semiconductor package SP10 according to some embodiments of the disclosure. In FIG. 3A, a carrier 200 optionally having a de-bonding layer 202 is provided. The carrier 200 and the de-bonding layer 202 may be similar to the carrier 100 and the de-bonding layer 102 previously described with reference to FIG. 1A. In some embodiments, one or more molded dies 170 and one or more semiconductor dies 210, 220 are disposed over the carrier 200, for example by a pick-and-place method. In some embodiments, the molded dies 170 have been preliminary processed together as described in FIG. 1A to FIG. 1G so as to have uniform initial thicknesses Ti170, and include semiconductor dies 120 molded in the encapsulant 150 and bonded to the micro-bumps 118. The molded dies 170 may have similar initial thicknesses Ti170, measured as the distance along the Z direction between the front surfaces 110f of the metal posts 110 (which may correspond to the front surface of the seed layer 104 when included) and the rear surface 121f of the top chips 121. The molded dies 170 may be disposed on the carrier 200 with the top chips 121 directed towards the carrier 200 and the micro-bumps 118 facing away from the carrier 200.

In some embodiments, the semiconductor dies 210, 220 may each independently have a different structure than the molded dies 170. For example, the semiconductor die 210 may include a semiconductor substrate 211 having active and/or passive devices formed therein, conductive pads 213 formed at the top surface 211t of the semiconductor substrate 211, and a protective layer 215 formed on the top surface 211t of the semiconductor substrate 211. Portions of the conductive pads 213 are exposed through openings of the protective layer 215. In some embodiments, the semiconductor die 210 may include metal posts 217 filling the openings of the protective layer 215 to contact the conductive pads 213, and a protective layer 219 disposed on the protective layer 215 and surrounding the metal posts 217. In some embodiments, top surfaces 217t of the metal posts 217 and the top surface 219t of the protective layer 219 form a front surface 210f of the semiconductor die 210.

The semiconductor dies 220 may have a similar structure as the semiconductor dies 210. For example, the semiconductor dies 220 may include a semiconductor substrate 221 having active and/or passive devices formed therein, conductive pads 223 formed at the top surface 221t of the semiconductor substrate 221, and a protective layer 225 formed on the top surface 221t of the semiconductor substrate 221. Portions of the conductive pads 223 are exposed through openings of the protective layer 225. In some embodiments, the semiconductor die 220 may include metal posts 227 filling the openings of the protective layer 225 to contact the conductive pads 223, and a protective layer 229 disposed on the protective layer 225 and surrounding the metal posts 227. In some embodiments, top surfaces 227t of the metal posts 227 may be buried within the protective layer 229 and the top surface 229t of the protective layer 229 may form a front surface 220f of the semiconductor die 220.

The structures illustrated in FIG. 3A for the semiconductor dies 210, 220 are merely examples, and other structures are contemplated within the scope of the disclosure. The semiconductor dies 210, 220 may each independently perform different functions. For example, each of the semiconductor dies 210, 220 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor dies 210, 220, either one or both, include a memory die such as a high bandwidth memory die. In some embodiments, the semiconductor dies 210, 220 may be the same type of dies or perform the same functions. In some embodiments, the semiconductor dies 210, 220 may be different types of dies or perform different functions. The disclosure is not limited by the type of dies used for the semiconductor dies 210, 220.

In some embodiments, the semiconductor dies 210, 220 are disposed with the corresponding rear surfaces 210r, 220r directed towards the carrier 200, with the conductive pads 213, 223 and the metal posts 217, 227 facing away from the carrier. In some embodiments, the semiconductor dies 210, 220 may have initial thicknesses Ti210, Ti220 different with respect to each other and with respect to the molded dies 170. The thicknesses Ti210, Ti220 are measured as the distance along the (vertical) Z direction between the front surfaces 210f, 220f and the corresponding opposite rear surfaces 210r, 220r.

In FIG. 3A, two molded dies 170, and two semiconductor dies 210, 220, are illustrated as included within a same package unit PU10, however, this is for illustration purpose only, and the disclosure does not limit the number of semiconductor dies 210, 220 or molded dies 170 included in a package unit PU10. In some alternative embodiments, fewer or more molded dies 170 and/or semiconductor dies 210, 220 than the ones illustrated in FIG. 3A may be included in a package unit PU10.

Figure 3B:
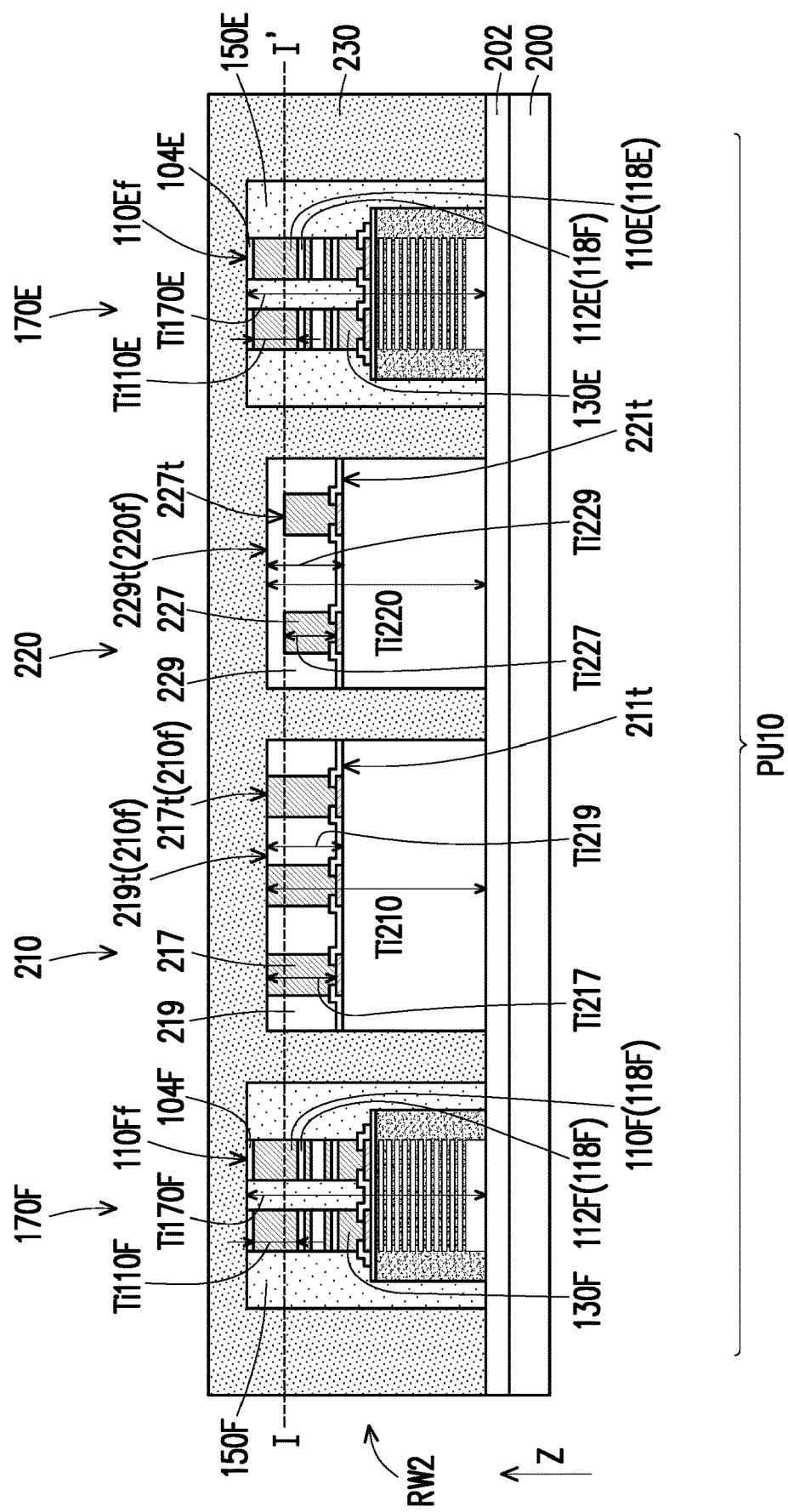

In FIG. 3B, an encapsulant 230 is formed over the carrier 200 to encapsulate the molded dies 170 and the semiconductor dies 210, 220. The encapsulant 230 may be initially formed of sufficient thickness along the Z direction so as to bury the front surfaces 210f, 220f of the semiconductor dies 210, 220, and the front surfaces 110f of the micro-bumps 118 of the molded dies 170. In some embodiments, the encapsulant 230 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant 230 is formed by a molding process, such as a compression molding process, or the like. In some embodiments, the encapsulant 230 may include an organic polymer and fillers. In some embodiments, the organic polymer used in the encapsulant 230 may be the same organic polymer used in the encapsulant 150 of the molded dies 170. On the other hand, the fillers included in the encapsulant 230 may be larger than the fillers used in the encapsulant 150. For example, when observed at a transmission electron microscope, the organic polymers of the encapsulants 150, 230 may appear the same, while the fillers included in the encapsulant 230 may be seen to be larger than the fillers included in the encapsulant 150. In some embodiments, a particle size of the fillers of the encapsulant 230 may be about in the range from 10 micrometers to 50 micrometers (e.g., measured along the longest dimension, such as a diameter, etc.). However, the disclosure is not limited thereto. In some alternative embodiments, the fillers included in the encapsulants 150 and 230 may have a similar size.

With the formation of the encapsulant 230, a reconstructed wafer RW2 is obtained. In some embodiments, the reconstructed wafer RW2 includes a plurality of package units PU10. In other words, the exemplary process may be performed at a reconstructed wafer level, so that multiple package units PU10 are processed in the form of the reconstructed wafer RW2. In the cross-sectional view of FIG. 3B, one package unit PU10 is shown for simplicity, but, of course, this is for illustrative purposes only, and the disclosure is not limited by the number of package units PU10 being produced in the reconstructed wafer RW2.

Figure 3C:
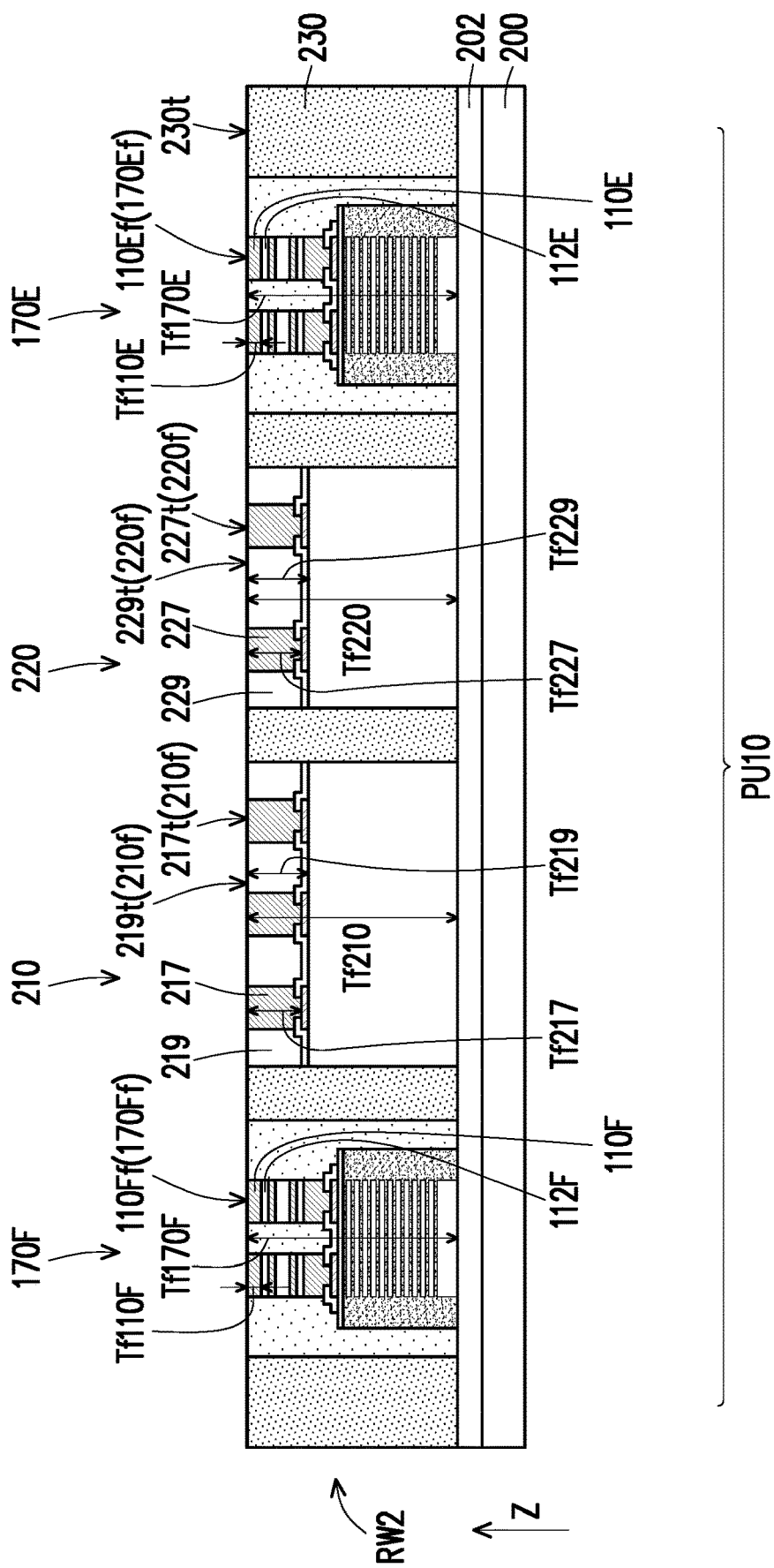

Referring to FIG. 3B and FIG. 3C, the encapsulant 230 may be thinned, until the micro-bumps 118 of the molded dies 170 and the metal posts 217, 227 of the semiconductor dies 210, 220 are exposed. For example, portions of the reconstructed wafer RW2 may be removed until reaching the level height along the (vertical) Z direction of the (horizontal) plane I-I'. The thinning of the reconstructed wafer RW2 may be performed through one or more steps including grinding, chemical-mechanical polishing, or the like.

Together with portions of the encapsulant 230, portions of the molded dies 170 and the semiconductor dies 210, 220 may also be removed. For example, the plane I-I' may fall anywhere within the vertical span of the joint micro-bumps 118, 130 such as within the vertical span of the metal posts 110 of the micro-bumps 118, so that the metal posts 110 may be thinned down from initial thicknesses Ti110 to final thicknesses Tf110. In the process, the seed layers 104 may be removed together with portions of the metal posts 110. In some embodiments, the thicknesses of the metal posts 110 may be measured along the Z direction, from the interface with the metal layer 112 to the front surfaces 110f of the metal posts 110. That is, the initial thicknesses Ti170 of the molded dies 170 may be reduced to final thicknesses Tf170 by removing material from the side of the front surfaces 110f of the micro-bumps 118. In some embodiments, the final thicknesses Tf170 may be about from 20% to 80% of the initial thicknesses Ti170. In some embodiments, portions of the encapsulants 150 are also removed together with the portions of the micro-bumps 118, so that the front surfaces 170f of the molded dies 170 become substantially co-planar with the top surface 230t of the encapsulant 230.

Similarly, the cutting plane I-I' may fall anywhere within the vertical span of the metal posts 217 and 227, so that, upon thinning of the reconstructed wafer RW2, the metal posts 217, 227 are exposed at the front surfaces 210f, 220f of the semiconductor dies 210, 220. Portions of the metal posts 217, 227 may be removed during thinning of the reconstructed wafer RW2, so that the initial thicknesses Ti217, Ti227 of the metal posts 217, 227 may be reduced to the final thicknesses Tf217, Tf227. In some embodiments, between 20% to 80% of the initial thicknesses Ti217, Ti227 of the metal posts 217, 227 may be removed, but the disclosure is not limited thereto. Portions of the protective layers 219, 229 may also be removed, thus reducing the initial thicknesses Ti219, Ti229 to final thicknesses Tf219, Tf229. That is, the semiconductor dies 210, 220 may be thinned to final thicknesses Tf210, Tf220 from the initial thicknesses Ti210, Ti220 by removing materials from the side of the front surfaces 210f, 220f.

In some embodiments, thinning of the reconstructed wafer RW2 may be considered a levelling process to render coplanar the front surfaces 170f of the molded dies 170, the front surfaces 210f, 220f of the semiconductor dies 210, 220, and the top surface 230t of the encapsulant 230 and to expose connective elements such as the metal posts 110, 217, 227 for the encapsulated molded dies 170 and semiconductor dies 210, 220. In some embodiments, the semiconductor dies 120 included in the molded dies 170 may have been formed with different manufacturing processes than the semiconductor dies 210, 220. For example, the semiconductor dies 120 may have been produced by a different manufacturer than the semiconductor dies 210 and/or 220, or even, the semiconductor die 120E included in the molded die 170E may have been produced by a different manufacturer than the semiconductor die 120F included in the molded die 170F. The different structures and, possibly production processes of the semiconductor dies 120, 210, 220 result in different initial thicknesses Ti120 (illustrated, e.g., in FIG. 1D), Ti210, and/or Ti220. When dies from different origins are to be incorporated in a same package unit PU10, setting the level height of the cutting plane I-I' may become troublesome if the semiconductor dies 120 and/or the semiconductor dies 210, 220 present a wide distribution of initial thicknesses. For example, if the initial thickness of the semiconductor die 120E is too different from the initial thickness of the semiconductor die 120F, a cutting plane which may be acceptable for the semiconductor die 120E may not be suitable for the semiconductor die 120F, and vice versa. However, if the semiconductor dies 120 are preliminary processed as illustrated in FIG. 1A to FIG. 1G to form molded dies 170, the issue of setting the level height of the cutting plane for the reconstructed wafer RW2 may be at least partially alleviated, as the distributio0n of the thicknesses of the molded dies 170 is narrower than the distribution of the thicknesses of the semiconductor dies 120. What is more, the joint micro-bumps 118, 130 offer a larger vertical window to select the level height of the cutting plane. In some embodiments, the semiconductor dies 120 may be preliminary processed in bulk, in the form of the reconstructed wafer RW1 (illustrated, e.g., in FIG. 1E), so that the thickness distribution of the dies 120 incorporated in the package unit PU10 may be narrowed or even uniformed in a cost-effective manner. In some embodiments, the preliminary processing may avoid or at least reduce the challenges and costs associated with preliminary sorting operations which may be required if semiconductor dies 120 of suitable thickness to be incorporated together are to be identified from batches produced or purchased in bulk before being placed on the carrier 200.

Figure 3D:
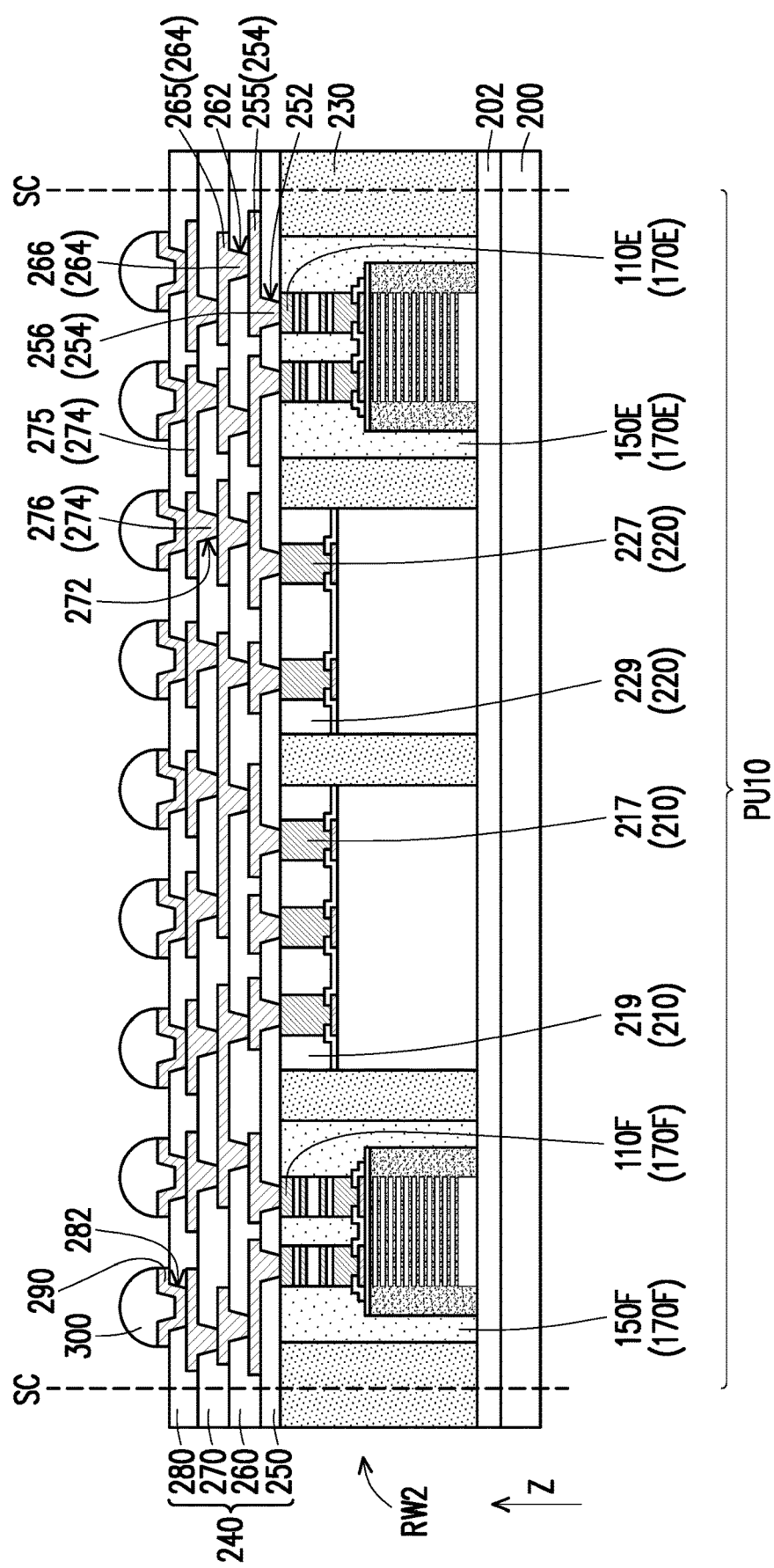

In FIG. 3D, a redistribution structure 240 is formed over the levelled molded dies 170, semiconductor dies 210, 220, and the encapsulant 230. In some embodiments, the redistribution structure 240 includes patterned dielectric layers 250, 260, 270, 280 and redistribution conductive layers 254, 264, 274 alternately stacked. The redistribution conductive layers 254, 264, 274 include routing traces 255, 265, 275 extending horizontally in between consecutively stacked dielectric layers 250, 260, 270, 280, and routing vias 256, 266, 276 extending through openings 252, 262, 272 of the underlying dielectric layers 250, 260, 270, to establish electrical connection with the underlying redistribution conductive layers 254, 264, the molded dies 170, or the semiconductor dies 210, 220. For example, the openings 252 of the dielectric layer 250 closer to the encapsulant 230 (the bottommost dielectric layer 240) expose at their bottom the metal posts 110 of the molded dies 170 or the metal posts 217, 227 of the semiconductor dies 210, 220. The routing traces 255 of the redistribution conductive layer 254 extend horizontally between the bottommost dielectric layer 250 and the upper dielectric layer 260, and the routing vias 256 extend through the openings 252 to connect the routing traces 255 to the metal posts 110, 217, or 227. Similarly, the routing traces 265 of the redistribution conductive layer 264 extends horizontally between the dielectric layer 260 and the upper dielectric layer 270, while the routing vias 266 extend through the openings 262 to establish electrical connection to the redistribution conductive layer 254. In some embodiments, the openings 252, 262, 272 may be filled by the routing vias 256, 266, 276. In some alternative embodiments, the routing vias 256, 266, 276 may line the openings 252, 262, 272, which may be filled by the dielectric material of the upper dielectric layers 260, 270, 280.

In some embodiments, the dielectric layers 250, 260, 270, 280 may independently include polyimide, epoxy resin, acrylic resin, phenol resin, benzocyclobutene (BCB), polybenzooxazole (PBO), or any other suitable polymer-based dielectric material. The dielectric layers 250, 260, 270, 280 may be formed by suitable fabrication techniques such as spin-on coating, chemical vapor deposition (CVD), plasma-enhanced chemical vapor deposition (PECVD), or the like. In some embodiments, the redistribution conductive layers 254, 264, 274 may independently include aluminum, titanium, copper, nickel, tungsten, and/or alloys thereof, for example. The redistribution conductive layers 254, 264, 274 may be formed by electroplating, deposition, and/or photolithography and etching. It should be noted that the number of redistribution conductive layers 254, 264, 274 and dielectric layers 250, 260, 270, 280 illustrated in FIG. 3D is merely for illustrative purposes, and the disclosure is not limited thereto. In some alternative embodiments, more or fewer redistribution conductive layers 254, 264, 274 and dielectric layers 250, 260, 270, 280 may be formed depending on the circuit design. In some embodiments, the molded dies 170 and the semiconductor dies 210, 220 within a same package unit PU10 are electrically interconnected through the redistribution structure 240.

In some embodiments, the dielectric layer 280 further away from the encapsulant 230 (the topmost dielectric layer 280) includes openings 282 exposing portions of the topmost redistribution conductive layer 274. In some embodiments, under-bump metallurgies 290 are formed in the openings 282, contacting the redistribution conductive layer 274 at the bottom of the openings 282 and further extending on portions of the dielectric layer 280 surrounding the openings 282. The under-bump metallurgies 290 may include one or more metallic layers, and may be formed through a sequence of plating steps employing auxiliary masks (not shown). In some embodiments, connective terminals 300 electrically contact the topmost redistribution conductive layer 274 through the openings 282. In some embodiments the connective terminals 300 are formed on the under-bump metallurgies 290 for improved adhesion and connection reliability. In some embodiments, the connective terminals 300 include ball grid array (BGA) balls or solder balls. In some embodiments, the connective terminals 300 may be placed on the under-bump metallurgies 290 through a ball placement process.

Figure 3E:
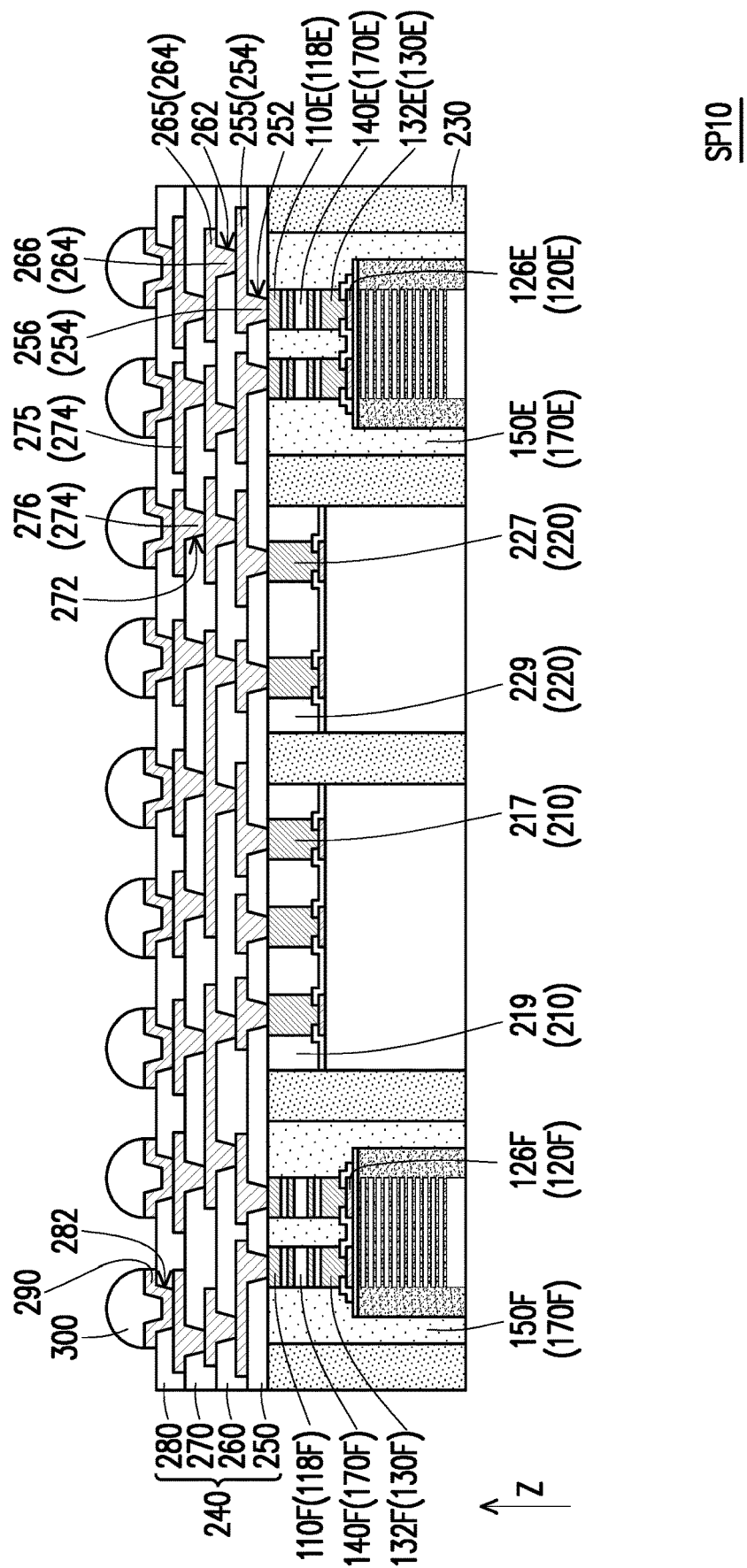

In some embodiments, as shown in FIG. 3D and FIG. 3E, a singulation step is performed to separate individual semiconductor packages SP10. In some embodiments, the semiconductor packages SP10 are separated by cutting through the reconstructed wafer RW2 along the scribing lanes SC arranged between individual package units PU10. In some embodiments, the singulation process involves performing a wafer dicing process with a rotating blade and/or a laser beam.

The semiconductor package SP10 includes one or more molded dies 170 and one or more semiconductor dies 210, 220 encapsulated in the encapsulant 230 and interconnected by the redistribution structure 240. The molded dies 170 include semiconductor dies 120 encapsulated by the encapsulants 150 and connected to the joint micro-bumps 130, 118. The joint metal layer 140 is formed at the junction between the micro-bumps 130 and 118. The encapsulant 150 separates the semiconductor dies 120 from the encapsulant 230, and also the joint micro-bumps 130, 118 from the encapsulant 230. In some embodiments, the redistribution structure 240 extends on the encapsulated molded dies 170 and semiconductor dies 210, 220. More specifically, the bottommost dielectric layer 250 of the redistribution structure 240 may extend on the encapsulant 230, the encapsulant 150 of the molded dies 170, and the protective layers 219, 229 of the semiconductor dies 210, 220. The bottommost redistribution conductive layer 254 may extend through the bottommost dielectric layer 250 to establish electrical contact with the metal posts 110 of the micro-bumps 118 of the molded dies 170, and with the metal posts 217, 227 of the semiconductor dies 210, 220.

Figure 4A:
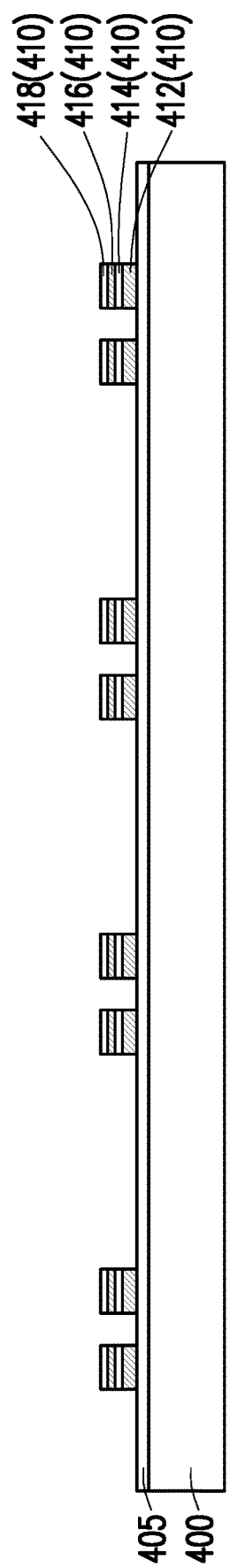
FIG. 4A to FIG. 4E show schematic cross-sectional views of structures produced at various stage of a manufacturing method of a semiconductor package according to some embodiments of the present disclosure.
Figure 4B:
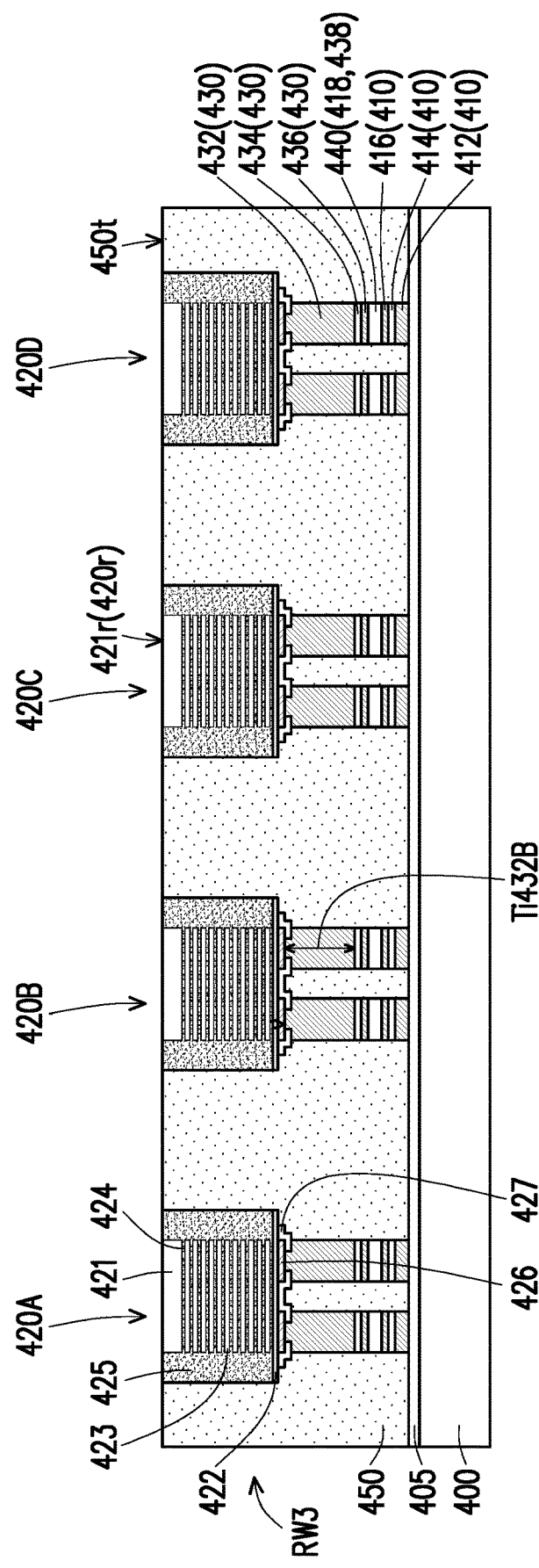
Figure 4C:
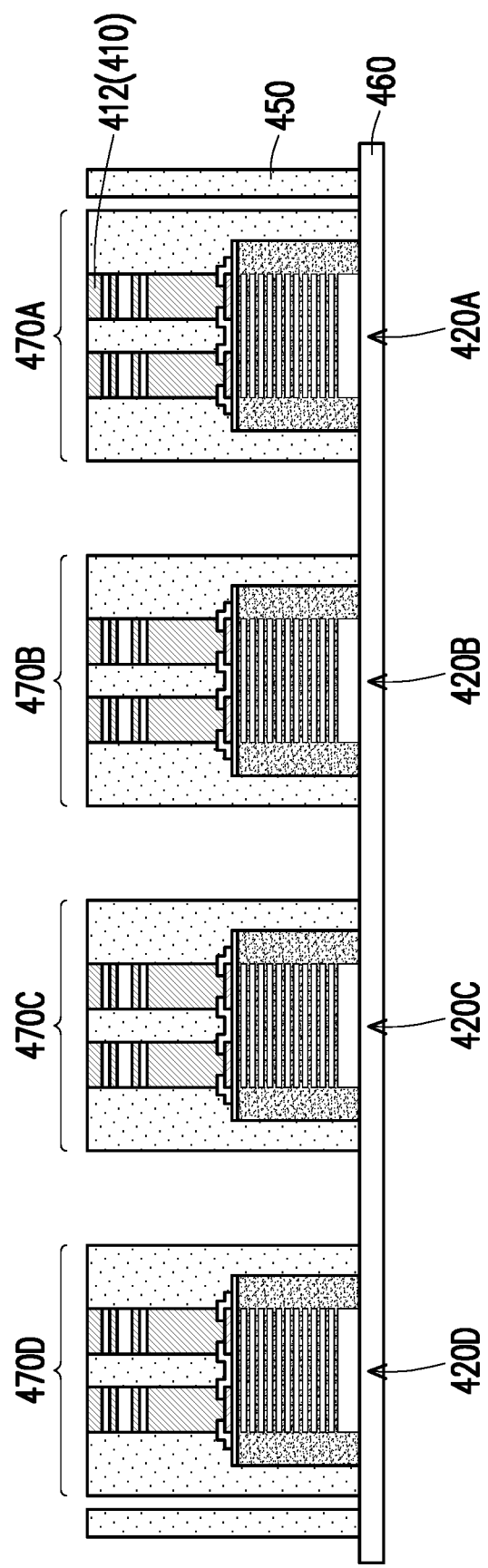

FIG. 4A to FIG. 4E are schematic cross-sectional views of a manufacturing method of a semiconductor package SP20 according to some embodiments of the disclosure. In the following, aspects which are not explicitly addressed may be assumed to be similar to what was previously described with reference from FIG. 1A to FIG. 3E. In FIG. 4A to FIG. 4C, molded dies 470 are formed following a similar process as previously described with reference to FIG. 1A to FIG. 1G. Briefly, a carrier 400, optionally with a de-bonding layer 405 disposed thereon, is provided. Micro-bumps 410 are formed on the carrier 400. The micro-bumps 410 include metal posts 412 and one or more metal layers 414, 416, 418. A difference between the micro-bumps 410 and the micro-bumps 118 of FIG. 1C lies in that the thickness of the metal posts 412 is smaller than the initial thickness Ti110 of the metal posts 110 (illustrated, e.g., in FIG. 3B). In some embodiments, the thickness of the metal posts 412 may be comparable to the individual thicknesses of the overlying metal layers 414, 416, 418, so that in some embodiments the metal posts 412 may be considered as an additional metal layer with respect to the metal layers 414, 416, 418. The metal posts 412 may be formed on seed layers (not shown), as previously described. Materials for the metal posts 412 and the overlying metal layers 414, 416, 418 may be selected as previously described for the corresponding elements of the micro-bumps 118.

In FIG. 4B, semiconductor dies 420 have been bonded to the micro-bumps 410 through micro-bumps 430 by forming a joint metal layer 440. The semiconductor dies 420 may have a similar structure to the semiconductor dies 120 of FIG. 1D, including top chips 421, a base chip 422, and chips 423 stacked between the top chip 421 and the base chip 422 and interconnected by mini-bumps 424. The chips 421, 422, 423 and the mini-bumps 424 are encapsulated by the encapsulant 425. Conductive pads 426 and a protective layer 427 are formed on a side of the base chip 422 opposite with respect to the stacked chips 423. The protective layer 427 includes openings exposing portions of the conductive pads 426. The micro-bumps 430 are formed on the conductive bumps 426 and have a similar structure with respect to the micro-bumps 130 of FIG. 1D. Briefly, the micro-bumps 430 include metal posts 432, and one or more metal layers 434, 436, 438. The joint metal layer 440 may be formed by reflowing together the metal layer 438 of the micro-bumps 430 and the metal layer 418 of the micro-bumps 410. In some embodiments, a difference between the micro-bumps 430 of FIG. 4B and the micro-bumps 130 of FIG. 1D lies in the initial thickness Ti432 of the metal posts 432. For example, the metal posts 432 may be thicker along the Z direction than the metal posts 132 of FIG. 1D.

In some embodiments, the semiconductor dies 420 may also present a certain distribution of initial thicknesses as previously described for the semiconductor dies 120. After the semiconductor dies 420 are bonded to the micro-bumps 410, the encapsulant 450 is formed to initially bury the semiconductor dies 420 within the reconstructed wafer RW3. Thereafter, the thickness of the reconstructed wafer RW3 is reduced by removing material from the side of the top surface 450t of the encapsulant 450, until the rear surfaces 420r of the semiconductor dies 420 and the top surface 450t of the encapsulant 450 are substantially coplanar. During thinning of the reconstructed wafer RW3, material may be removed from the semiconductor dies 420 from the side of the rear surfaces 421e of the top chips 421. The removed material may include portions of the top chips 121 and the encapsulant 425.

Referring to FIG. 4B and FIG. 4C, the reconstructed wafer RW3 is disposed overturned on the supporting frame 460, and the carrier 400 is peeled away together with the de-bonding layer 405 (if included). The reconstructed wafer RW3 is disposed on the supporting frame 460 oriented so that upon removal of the carrier 400, the metal posts 412 are exposed. Molded dies 470 of uniform thickness are obtained upon singulation of the reconstructed wafer RW3 by cutting through portions of the encapsulant 450 in between the semiconductor dies 420, similar to what was previously described with reference to FIG. 1F and FIG. 1G.

Figure 4D:
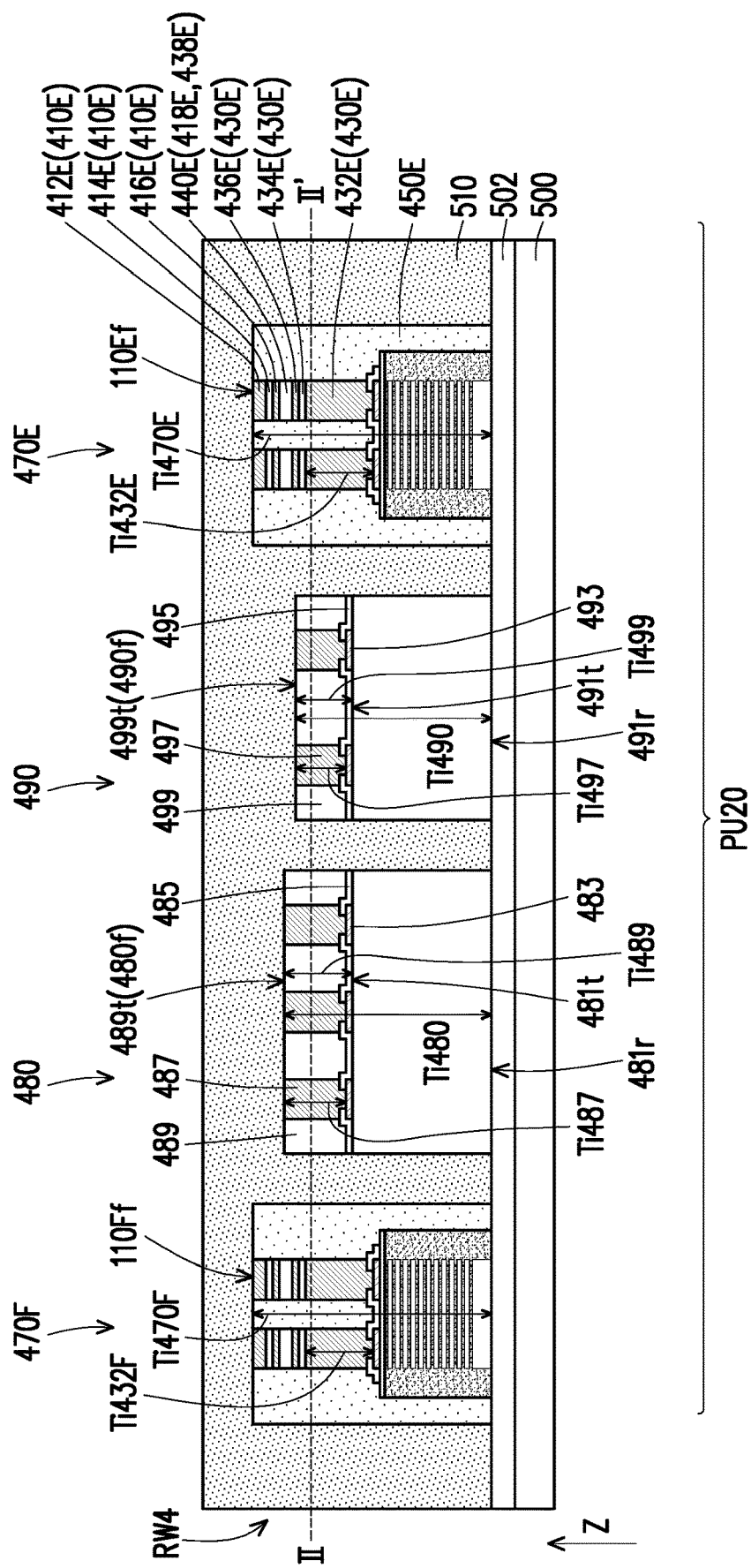

In FIG. 4D, one or more molded dies 470, and one or more semiconductor dies 480, 490 are disposed on a carrier 500 to form a plurality of package units PU20. The carrier 500 may optionally have a de-bonding layer 402 formed thereon, so that the molded dies 470 and the semiconductor dies 480, 490 may be disposed on the de-bonding layer 502. The semiconductor dies 480, 490 may have similar structures as previously described for the semiconductor dies 210, 220. Briefly, the semiconductor dies 480, 490 include semiconductor substrates 481, 491 and conductive pads 483, 493 and protective layers 485, 495 formed on top surfaces 481t, 491t of the semiconductor substrates 481, 491. The protective layers 485, 495 include openings exposing portions of the conductive pads 483, 493. Metal posts 487, 497 are formed in the openings of the protective layers 485, 495 to contact the conductive pads 483, 493, and protective layers 489, 499 are formed on the protective layers 485, 495 to surround the metal posts 487, 497. The initial thicknesses Ti470 of the molded dies 470 and the initial thicknesses Ti480, Ti490 of the semiconductor dies 480, 490 may all different from each other. An encapsulant 510 is formed over the carrier 500 to encapsulate the molded dies 470 and the semiconductor dies 480, 490, thus forming a reconstructed wafer RW4. The encapsulant 510 may be initially formed so as to bury the molded dies 470 and the semiconductor dies 480, 490.

Figure 4E:
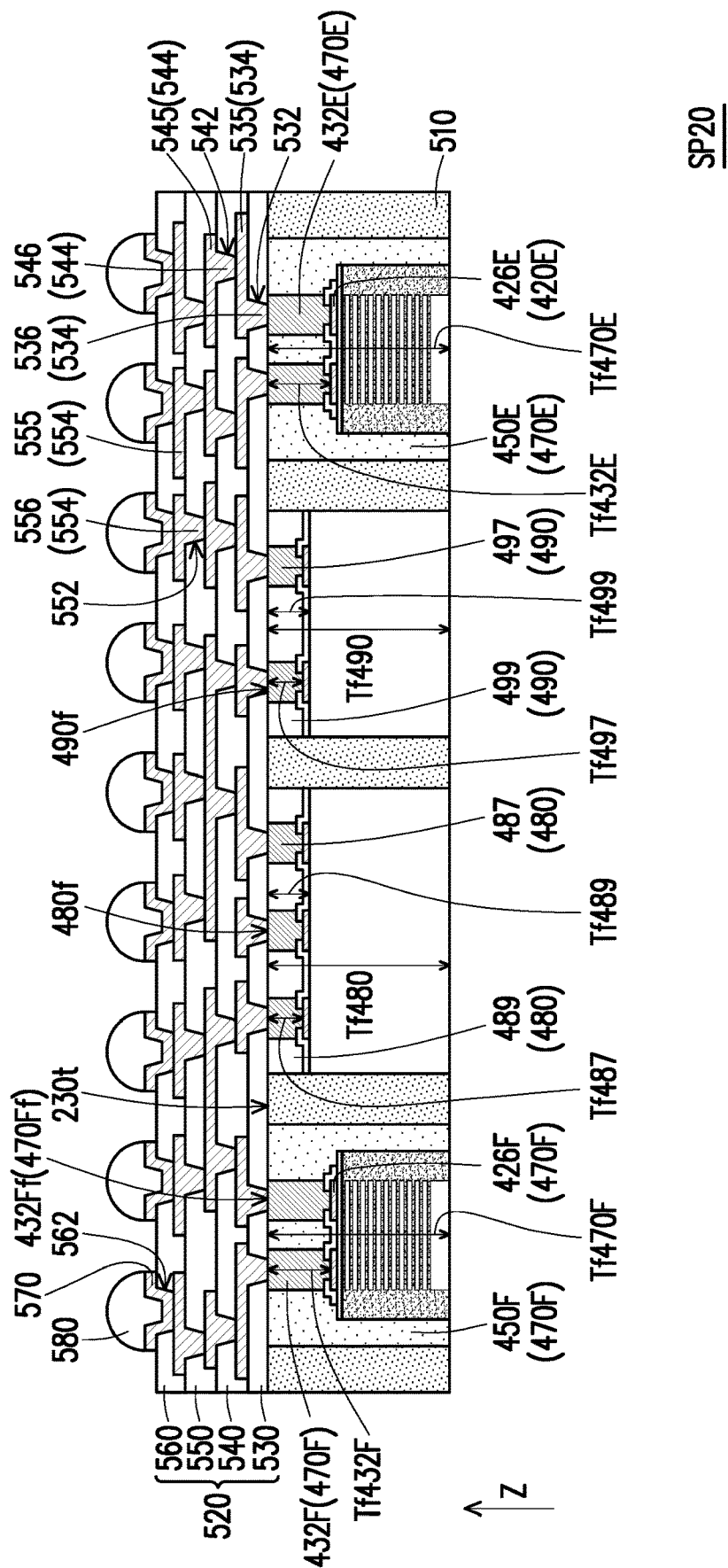

Referring to FIG. 4D and FIG. 4E, a semiconductor package SP20 may be obtained from the structure illustrated in FIG. 4D by performing similar process steps as previously described with reference from FIG. 3B to FIG. 3E. Briefly, the reconstructed wafer RW4 is thinned down to the level height of the cutting plane II-II' along the Z direction, until the metal posts 487, 497 of the semiconductor dies 480, 490 are exposed. The thinning of the reconstructed wafer RW4 may be performed through one or more steps including grinding, chemical-mechanical polishing, or the like.

Together with portions of the encapsulant 510, portions of the molded dies 470 and the semiconductor dies 480, 490 may also be removed. For example, the plane II-II' may fall anywhere within the vertical span of the joint micro-bumps 410, 430 such as within the vertical span of the metal posts 432 of the micro-bumps 430, so that the metal posts 432 may be thinned down from initial thicknesses Ti432 to final thicknesses Tf432. In the process, the micro-bumps 410, the metal layers 414, 416, 432, 434, and the joint metal layer 440 may be removed together with portions of the metal posts 432. In some embodiments, the thicknesses Ti432, Tf432 of the metal posts 432 is measured along the Z direction. The initial thickness Ti432 is measured as the distance from the interface with the metal layer 434 to the interface with the conductive pads 426, and the final thickness Tf432 is measured as the distance from the front surface 470f of the molded die 470 to the conductive pad 426. That is, the initial thicknesses Ti470 of the molded dies 470 may be reduced to final thicknesses Tf470 by removing material from the side of the front surfaces 432f of the micro-bumps 430. In some embodiments, portions of the encapsulants 450 are also removed together with the micro-bumps 410 and the portions of the micro-bumps 430, so that the front surfaces 470f of the molded dies 470 become substantially co-planar with the top surface 230t of the encapsulant 230.

Similarly, the cutting plane II-II' may fall anywhere within the vertical span of the metal posts 487 and 497, so that, upon thinning of the reconstructed wafer RW4, the metal posts 487, 497 are exposed at the front surfaces 480f, 490f of the semiconductor dies 480, 490. Portions of the metal posts 487, 497 and of the protective layers 489, 499 may be removed during thinning of the reconstructed wafer RW4, so that the initial thicknesses Ti487, Ti497 of the metal posts 487, 497 may be reduced to the final thicknesses Tf487, Tf497, and the initial thicknesses Ti489, Ti499 of the protective layers 489, 499 may be reduced to the final thicknesses Tf489, Tf499. That is, the semiconductor dies 480, 490 may be thinned to final thicknesses Tf480, Tf490 from the initial thicknesses Ti480, Ti490 by removing materials from the side of the front surfaces 480f, 490f.

After thinning of the reconstructed wafer RW4, the redistribution structure 520 is formed on the encapsulated molded dies 470 and semiconductor dies 480, 490, following similar processes as previously described with reference to FIG. 3D. Briefly, the dielectric layers 530, 540, 550, 560 and the redistribution conductive layers 534, 544, 554 are alternately stacked. The redistribution conductive layers 534, 544, 554 include routing traces 535, 545, 555 and routing vias 536, 546, 556 extending within the openings 532, 542, 552 of the dielectric layers 530, 540, 550. In some embodiments, the bottommost redistribution conductive layer 534 directly contacts the metal posts 432 formed on the molded semiconductor dies 420, as well as the metal posts 487, 497 of the semiconductor dies 480, 490. Under-bump metallurgies 570 may be formed in the openings 562 of the topmost dielectric layer 560. The connective terminals 580 are formed in correspondence of the openings 562 (on the under-bump metallurgies 570, if included), to contact the topmost redistribution conductive layer 554. The semiconductor package SP20 may be obtained by singulation of the reconstructed wafer RW4.

As illustrated by the process of FIG. 4A to FIG. 4E, in some embodiments, when thicker metal posts 432 are formed on the conductive pads 426 of the semiconductor dies 420, the semiconductor dies 420 may be bonded to thinner micro-bumps 410 (illustrated, e.g., in FIG. 4A) during the preliminary processing step. By doing so, the micro-bumps 410 and the joint metal layer 440 (illustrated, e.g., in FIG. 4B) may be entirely removed during thinning of the reconstructed wafer RW4 (illustrated, e.g., in FIG. 4D) including the encapsulated molded dies 470. By doing so, the semiconductor dies 420 included in the molded dies 470 may be directly connected to the redistribution structure 520 via the metal posts 432.

FIG. 5A to FIG. 5D are schematic cross-sectional views of structure formed during a manufacturing method of a semiconductor package SP30 according to some embodiments of the disclosure. In the following, aspects which are not explicitly addressed may be assumed to be similar to what was previously described with reference from FIG. 1A to FIG. 3E. The structure illustrated in FIG. 5A may be obtained following similar processes as previously described with reference to FIG. 1A to FIG. 1E. Briefly, a carrier 600 optionally having a de-bonding layer 602 is provided. Micro-bumps 610 are formed over the carrier 600. The micro-bumps 610 include metal posts 612 and one or more metal layers 614, 616, 618, stacked on the metal posts 612. The metal posts 612 of the micro-bumps 610 may be thicker (as described, e.g., for the metal posts 110 of FIG. 1C), or thinner (as described, e.g., for the metal posts 412 of FIG. 4A). Semiconductor dies 620 are bonded to the micro-bumps 610 through micro-bumps 630 formed on conductive pads 626 of the semiconductor dies 620. The semiconductor dies 620 may have a similar structure as previously described for the semiconductor dies 120 (illustrated, e.g., in FIG. 1D), and may present a distribution of thicknesses T621, for example because of variations in the thicknesses T621 of the constituent top chips 621, and so on. For example, the top chip 621C of the semiconductor die 620C may be thicker than the top chip 621B of the semiconductor die 620B (i.e., the thickness T621C may be greater than the thickness T621B). The micro-bumps 630 may have a similar structure as previously described for the micro-bumps 130, including metal posts 632 formed on the conductive pads 626, and one or more metal layers 634, 636, 638 formed on the metal posts 632. The metal layers 618, 638 are reflowed together to form the joint metal layer 640 when the semiconductor dies 620 are bonded to the micro-bumps 610.

Figure 5A:
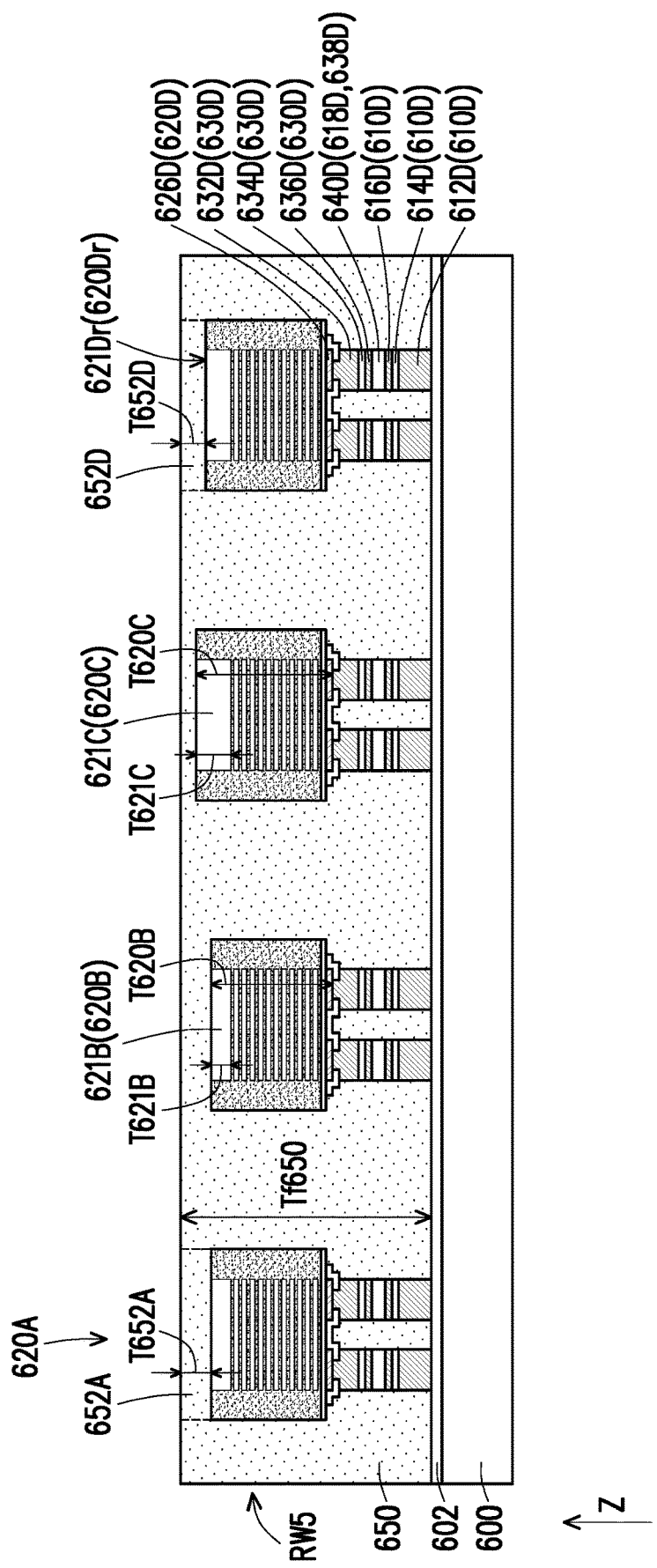
FIG. 5A to FIG. 5D show schematic cross-sectional views of structures produced at various stage of a manufacturing method of a semiconductor package according to some embodiments of the present disclosure.

After the semiconductor dies 620 are encapsulated in an encapsulant 650 to form the reconstructed wafer RW5, a structure such as the one of FIG. 1E is obtained. In some embodiments, the reconstructed wafer RW5 is thinned by removing a portion of the encapsulant 650, so that the encapsulant has a final thickness Tf650. In some embodiments, differently than in the process illustrated in FIG. 1E and FIG. 1F, the encapsulant 650 is thinned without exposing the top chips 621C of the semiconductor dies 620. That is, portions 652 of the encapsulant 650 remains on top of the semiconductor dies 620 even after the encapsulant 650 is thinned. In the embodiment of FIG. 1E and FIG. 1F, some back-grinding of the rear surface of the semiconductor dies 120 takes place during planarization of the encapsulant 150. However, in some cases back-grinding of the semiconductor dies 120 may not be possible, for example because the semiconductor dies 120 would be damaged by such a process, or because the variation in thickness could be so large that too great a portion of the top chips of thicker semiconductor dies may have to be removed in order to expose the top surfaces of the thinner semiconductor dies. In such cases, performing a preliminary processing according to the present embodiment may be possible, and, in some cases, desirable in order to narrow the thickness distribution before incorporating the semiconductor dies 620 into a reconstructed wafer for further processing. As illustrated in FIG. 5A the thicknesses T652 of the portions 652 of encapsulant 650 remaining over the semiconductor dies 620 may be inversely correlated with the thickness T620 of the semiconductor dies 620. That is, thinner portions 652 of the encapsulant 650 will remain on thicker semiconductor dies 620 (such as the portion 652D on the semiconductor die 620) than portions 652 of the encapsulant 650 remaining on thinner semiconductor dies 620 (such as the portion 652A on the semiconductor die 620A). It will be apparent that the disclosure is not limited to the cases in which all top chips 121 (illustrated, e.g., in FIG. 1F) are grinded or all top chips 621 remain buried within the encapsulant 650. Rather, embodiments in which some semiconductor dies 620 remains buried while portions of the top chips 621 of other semiconductor dies 620 are grinded are also possible and contemplated within the scope of the disclosure.

Figure 5B:
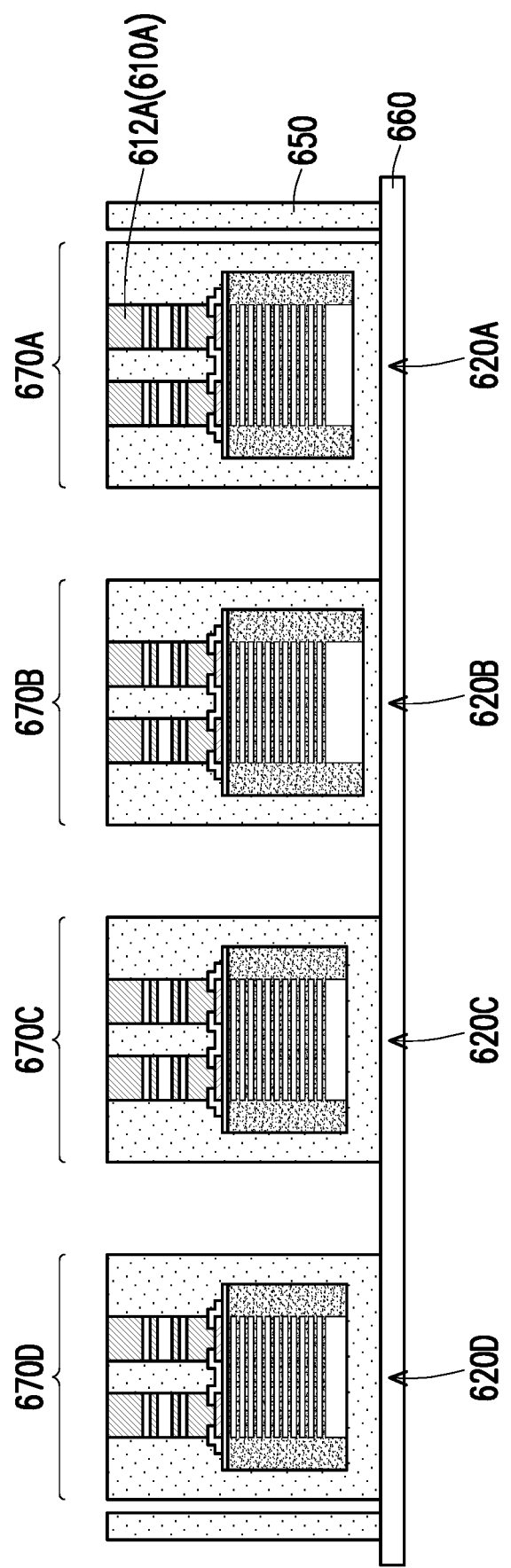

Referring to FIG. 5A and FIG. 5B, the reconstructed wafer RW5 is disposed overturned on the supporting frame 660, and the carrier 600 is peeled away together with the de-bonding layer 602 (if included). The reconstructed wafer RW5 is disposed on the supporting frame 660 oriented so that upon removal of the carrier 600, the metal posts 612 of the micro-bumps 610 are exposed. Molded dies 670 of uniform thickness are thus obtained upon singulation of the reconstructed wafer RW5 by cutting through portions of the encapsulant 650 in between the semiconductor dies 620, similar to what was previously described with reference to FIG. 1F and FIG. 1G.

Figure 5C:
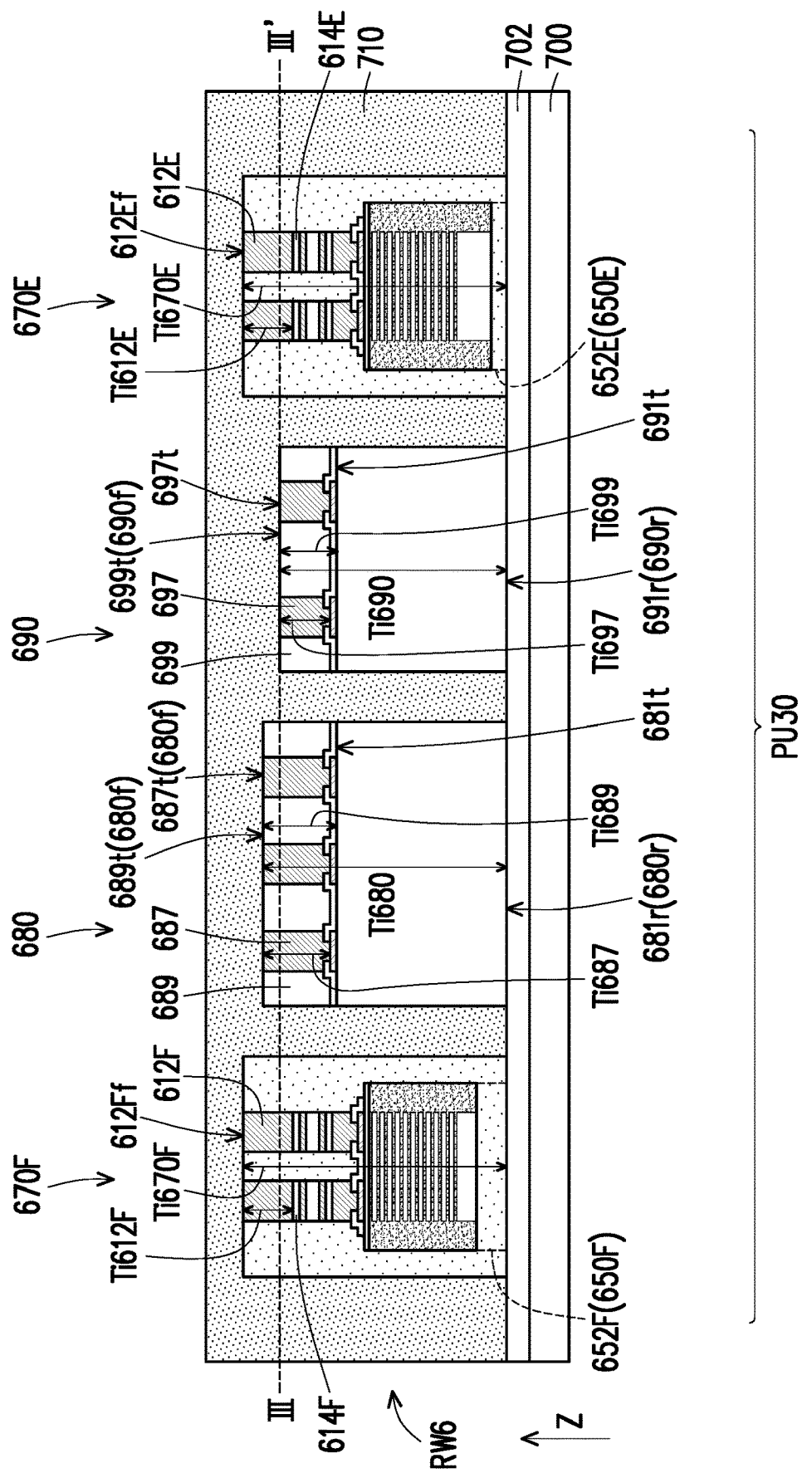

In FIG. 5C, one or more molded dies 670, and one or more semiconductor dies 680, 690 are disposed on a carrier 700 to form a plurality of package units PU30. The carrier 700 may optionally have a de-bonding layer 702 formed thereon, so that the molded dies 670 and the semiconductor dies 680, 690 may be disposed on the de-bonding layer 702. The semiconductor dies 680, 690 may have similar structures as previously described for the semiconductor dies 210, 220. In some embodiments, the molded dies 670 are disposed with the portions 652 of the encapsulant 650 facing the carrier 200. In some embodiments, as illustrated, in FIG. 5C, the portions 652 of the encapsulant 650 included in different molded dies 670 may have different thicknesses with respect to each other. For example, the portion 652F of encapsulant 650F of the molded die 670F may be thicker than the portion 652E of encapsulant 650E of the molded die 670E. As in the embodiments previously described, the initial thicknesses Ti670 of the molded dies 670 and the initial thicknesses Ti680, Ti690 of the semiconductor dies 680, 690 may be different from each other. An encapsulant 710 is formed over the carrier 700 to encapsulate the molded dies 670 and the semiconductor dies 680, 690, thus forming a reconstructed wafer RW6. The encapsulant 710 may be initially formed so as to bury the molded dies 670 and the semiconductor dies 680, 690.

Figure 5D:
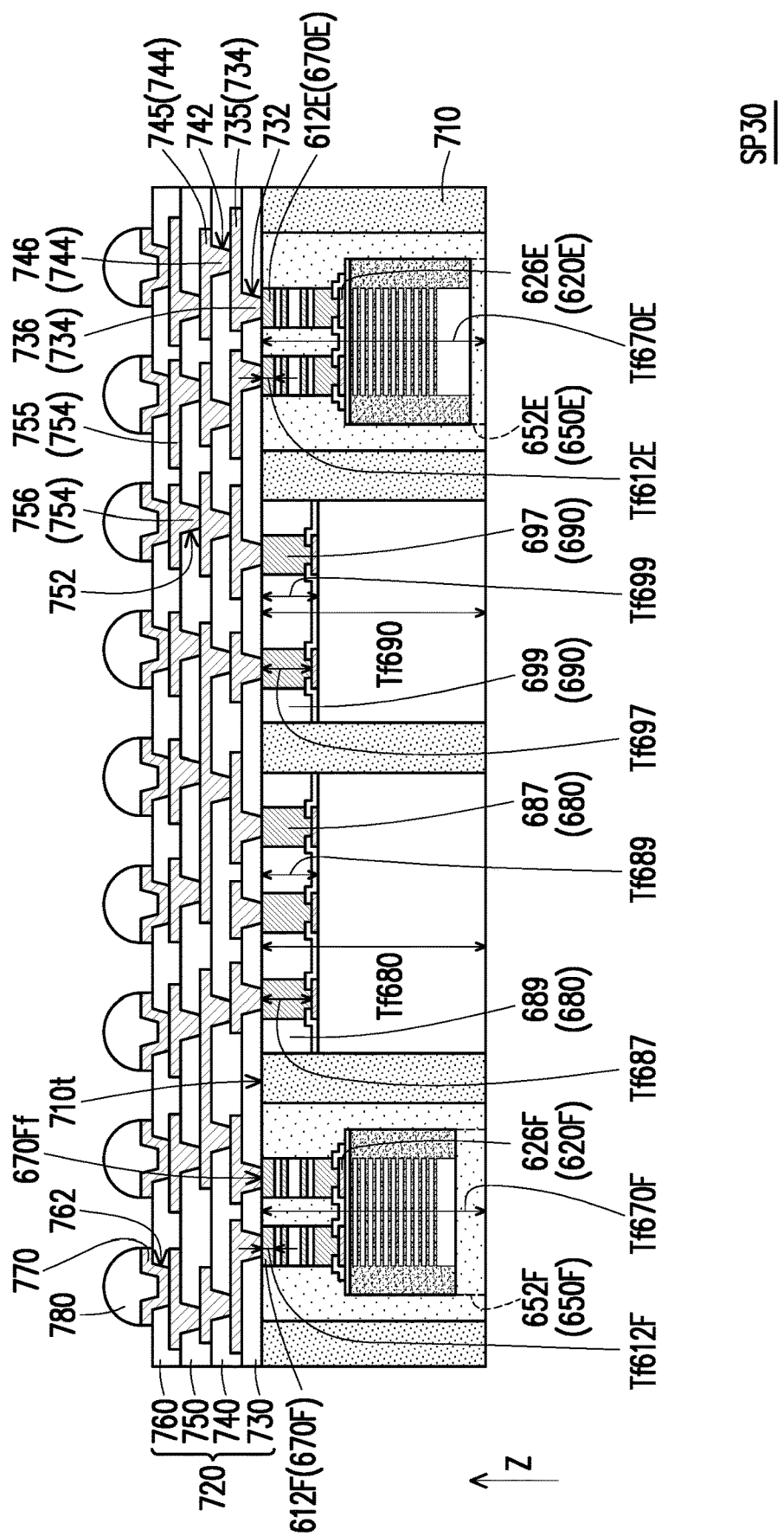

Referring to FIG. 5C and FIG. 5D, a semiconductor package SP20 may be obtained from the structure illustrated in FIG. 5C by performing similar process steps as previously described with reference from FIG. 3B to FIG. 3E. Briefly, the reconstructed wafer RW6 is thinned down to the level height of the cutting plane III-III' along the Z direction, until the metal posts 687, 697 of the semiconductor dies 680, 690 are exposed. The thinning of the reconstructed wafer RW6 may be performed through one or more steps including grinding, chemical-mechanical polishing, or the like.

Together with portions of the encapsulant 710, portions of the molded dies 670 and the semiconductor dies 680, 690 may also be removed. For example, the plane III-III' may fall within the vertical span of the metal posts 612, so that the metal posts 612 may be thinned down from initial thicknesses Ti612 to final thicknesses Tf612. As in the previous embodiments, the thicknesses Ti612 and Tf612 are measured from the front surfaces 612f of the metal posts 612 to the interface with the metal layers 614. That is, the initial thicknesses Ti670 of the molded dies 670 may be reduced to final thicknesses Tf670 by removing material from the side of the front surfaces 612f of the metal posts 612. In some embodiments, portions of the encapsulants 650 are also removed together with the portions of the metal posts 612, so that the front surfaces 670f of the molded dies 670 become substantially co-planar with the top surface 710t of the encapsulant 710. However, the disclosure is not limited thereto, and, in some alternative embodiments, a cutting plane at the level height described in FIG. 4D and FIG. 4E may be selected.

Similarly, the cutting plane III-III' may fall anywhere within the vertical span of the metal posts 687 and 697, so that, upon thinning of the reconstructed wafer RW6, the metal posts 687, 697 are exposed at the front surfaces 680f, 690f of the semiconductor dies 680, 690. Portions of the metal posts 687, 697 and of the protective layers 689, 699 may be removed during thinning of the reconstructed wafer RW6, so that the initial thicknesses Ti687, Ti697 of the metal posts 687, 697 may be reduced to the final thicknesses Tf687, Tf697, and the initial thicknesses Ti689, Ti699 of the protective layers 689, 699 may be reduced to the final thicknesses Tf689, Tf699. As in the previous embodiments, the thicknesses Ti687, Tf687, Ti697, Tf697 of the metal posts 687, 697 are measured as the (vertical) distance from the front surfaces 680f, 690f to the corresponding conductive pads 683, 693, and the thicknesses Ti689, Tf689, Ti699, Tf699 of the protective layers 689, 699 are measured as the (vertical) distance from the front surfaces 680f, 690f to the top surfaces 681t, 691t of the corresponding semiconductor substrates 681, 691. That is, the semiconductor dies 680, 690 may be thinned to final thicknesses Tf680, Tf690 from the initial thicknesses Ti680, Ti690 by removing materials from the side of the front surfaces 680f, 690f.

After thinning of the reconstructed wafer RW6, the redistribution structure 720 is formed on the encapsulated molded dies 670 and semiconductor dies 680, 690, following similar processes as previously described with reference to FIG. 3D. Briefly, the dielectric layers 730, 740, 750, 760 and the redistribution conductive layers 734, 744, 754 are alternately stacked. The redistribution conductive layers 734, 744, 754 include routing traces 735, 745, 755 and routing vias 736, 746, 756 extending within the openings 732, 742, 752 of the dielectric layers 730, 740, 750. Under-bump metallurgies 770 may be formed in the openings 762 of the topmost dielectric layer 760. The connective terminals 780 are formed in correspondence of the openings 762 (on the under-bump metallurgies 770, if included), to contact the topmost redistribution conductive layer 754. The semiconductor package SP30 may be obtained by singulation of the reconstructed wafer RW6.

FIG. 6A to FIG. 6F are schematic cross-sectional views of structures formed during a manufacturing method of a semiconductor package SP40 according to some embodiments of the disclosure. In the following, aspects which are not explicitly addressed may be assumed to be similar to what was previously described with reference from FIG. 1A to FIG. 3E. The structure illustrated in FIG. 6A may be obtained following similar processes as previously described with reference to FIG. 1A to FIG. 1E. Briefly, a carrier 800 optionally having a de-bonding layer 802 is provided. Micro-bumps 810 are formed over the carrier 800. The micro-bumps 810 include metal posts 812 and one or more metal layers 814, 816, 818, stacked on the metal posts 812. The metal posts 812 of the micro-bumps 810 may be thicker (as described, e.g., for the metal posts 110 of FIG. 1C), or thinner (as described, e.g., for the metal posts 412 of FIG. 4A). Semiconductor dies 820 are bonded to the micro-bumps 810 through micro-bumps 830 formed on the conductive pads 826 of the semiconductor dies 820. The semiconductor dies 820 may have a similar structure as previously described for the semiconductor dies 120 (illustrated, e.g., in FIG. 1D), and may present a distribution of thicknesses Ti821, for example because of variations in the thicknesses Ti821 of the constituent top chips 821, and so on. For example, the top chip 821C of the semiconductor die 820C may be thicker than the top chip 821B of the semiconductor die 820B (i.e., the thickness 8621C may be greater than the thickness T821B). The micro-bumps 830 may have a similar structure as previously described for the micro-bumps 130, including metal posts 832 formed on the conductive pads 826, and one or more metal layers 834, 836, 838 formed on the metal posts 832. The metal layers 818, 838 are reflowed together to form the joint metal layer 840 when the semiconductor dies 820 are bonded to the micro-bumps 810.

In some embodiments, underfills 850 are formed between the semiconductor dies 820 and the carrier 800. The underfills 850 surround the joint micro-bumps 810, 830. In some embodiments, the underfills 850 are formed by a molding process, such as compression molding. In some embodiments, the underfills 850 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the underfills 850 may include an organic polymer and fillers. The fillers may be selected to be sufficiently small so as to allow the underfill 850 to fill the space between the semiconductor dies 820 and the carrier 800, seeping in the interstices defined by the joint micro-bumps 810, 830. In some embodiments, the fillers may include carbon-based materials, inorganic materials (such as silica, ceramic materials, etc.), a combination thereof, or the like. In some embodiments, a particle size of the fillers of the underfill 850 may be about in the range from 0.5 micrometers to 3 micrometers (e.g., measured along the longest dimension, such as a diameter, etc.).

Figure 6A:
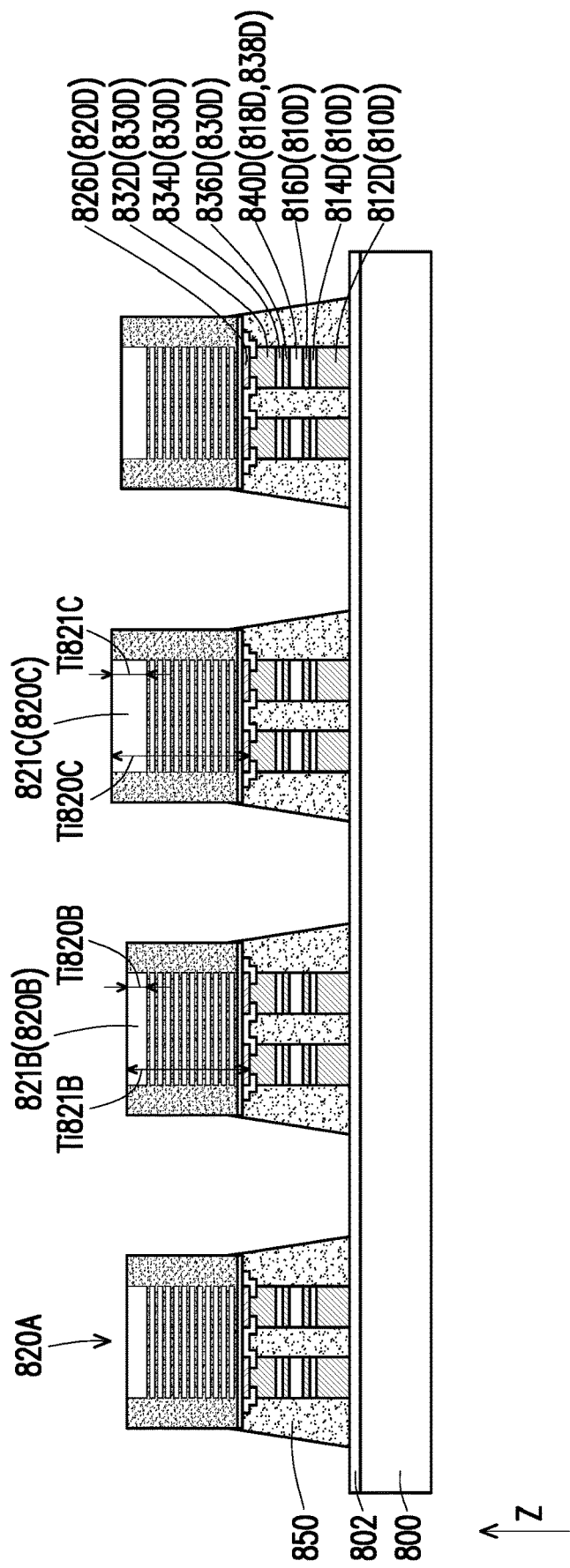
FIG. 6A to FIG. 6F show schematic cross-sectional views of structures produced at various stage of a manufacturing method of a semiconductor package according to some embodiments of the present disclosure.
Figure 6B:
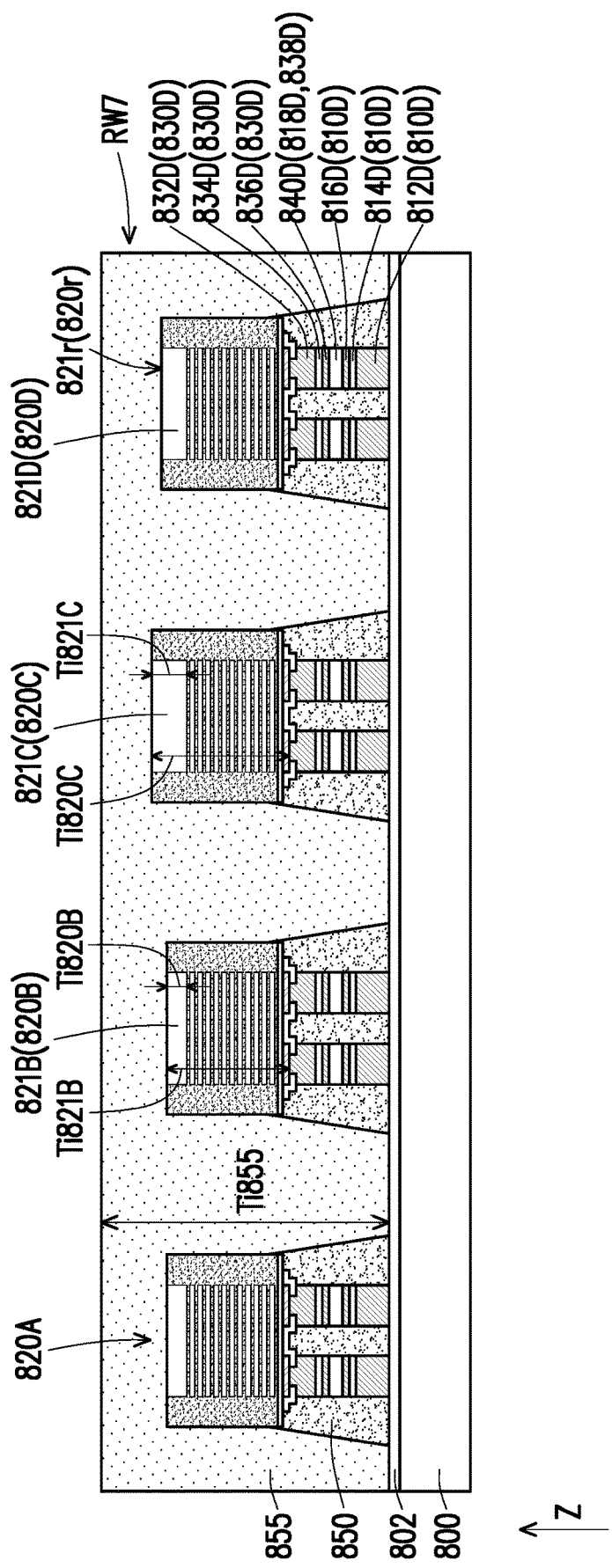

In FIG. 6B, the semiconductor dies 820 are encapsulated in an encapsulant 855 to form the reconstructed wafer RW7. In some embodiments, the encapsulant 855 is initially formed of sufficient thickness to bury the rear surfaces 820r of the semiconductor dies 820. In some embodiments, the encapsulant 855 also includes an organic polymer and fillers. In some embodiments, the encapsulant 855 and the underfills 850 may include the same organic polymer. In some embodiments, the fillers included in the underfills 850 may be smaller than the fillers included in the encapsulant 855. For example, when observed under a transmission electron microscope, the fillers of the underfills 850 appear smaller than the fillers of the encapsulant 855. In some embodiments, the fillers of the underfills 850 may be up to about 10 times smaller than the fillers of the encapsulant 855.

Figure 6C:
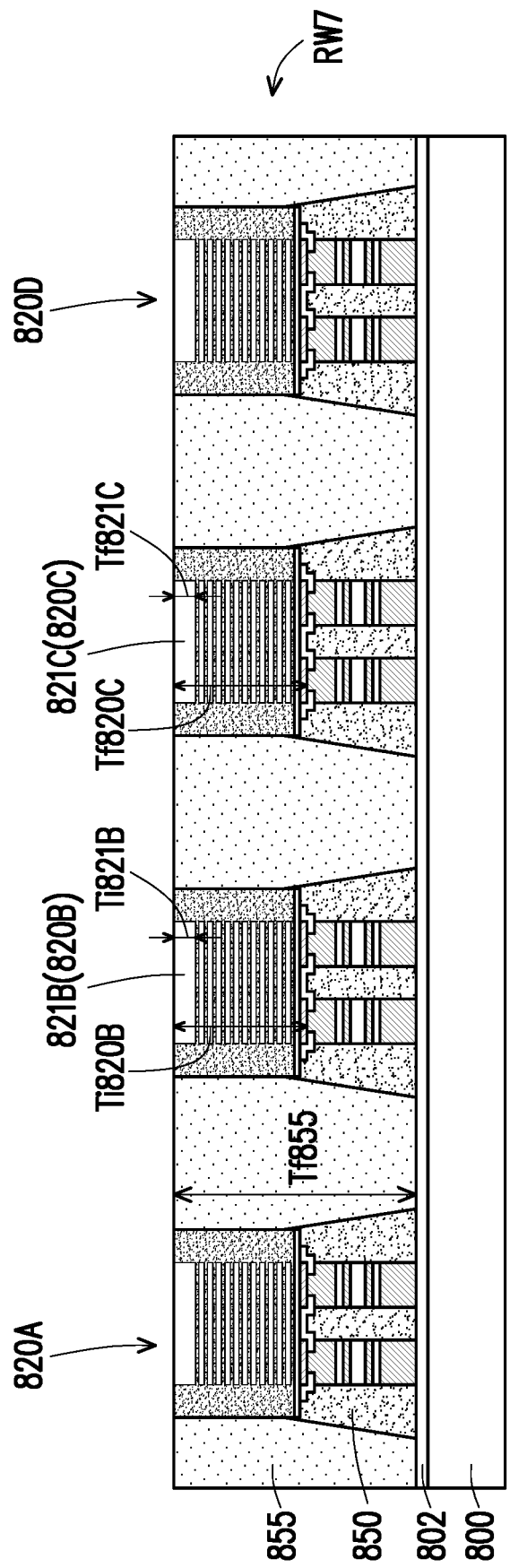

Referring to FIG. 6B and FIG. 6C, in some embodiments, the reconstructed wafer RW7 is thinned, for example by removing a portion of the encapsulant 855, so that the top chips 821 of the semiconductor dies 820 are exposed. In some embodiments, portions of the top chips 821 may also be removed, so that the final thicknesses Tf820 of the semiconductor dies 820 and the final thicknesses Tf821 of the top chips 821 may be smaller than the corresponding initial thicknesses Ti820 and Ti821, similar to what was previously described with reference to FIG. 1E and FIG. 1F.

However, the disclosure is not limited thereto, and, in some alternative embodiments, the thinning of the reconstructed wafer RW7 may be performed leaving the semiconductor dies 820 buried by portions of the encapsulant 855, as previously discussed for the reconstructed wafer RW5 with reference to FIG. 5A.

Figure 6D:
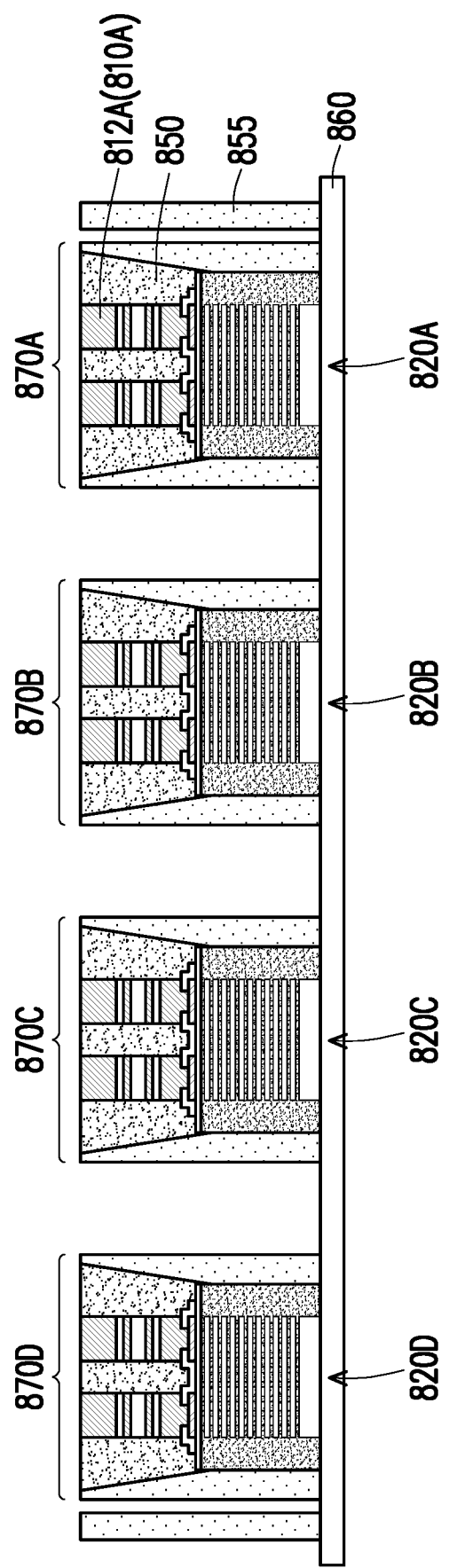

Referring to FIG. 6C and FIG. 6D, the reconstructed wafer RW7 is disposed overturned on the supporting frame 860, and the carrier 800 is peeled away together with the de-bonding layer 802 (if included). The reconstructed wafer RW7 is disposed on the supporting frame 860 oriented so that upon removal of the carrier 800, the metal posts 812 of the micro-bumps 810 and the underfills 850 are exposed. Molded dies 870 of uniform thickness are thus obtained upon singulation of the reconstructed wafer RW7 by cutting through portions of the encapsulant 855 (and, possibly the underfills 850) in between the semiconductor dies 820, similar to what was previously described with reference to FIG. 1F and FIG. 1G.

Figure 6E:
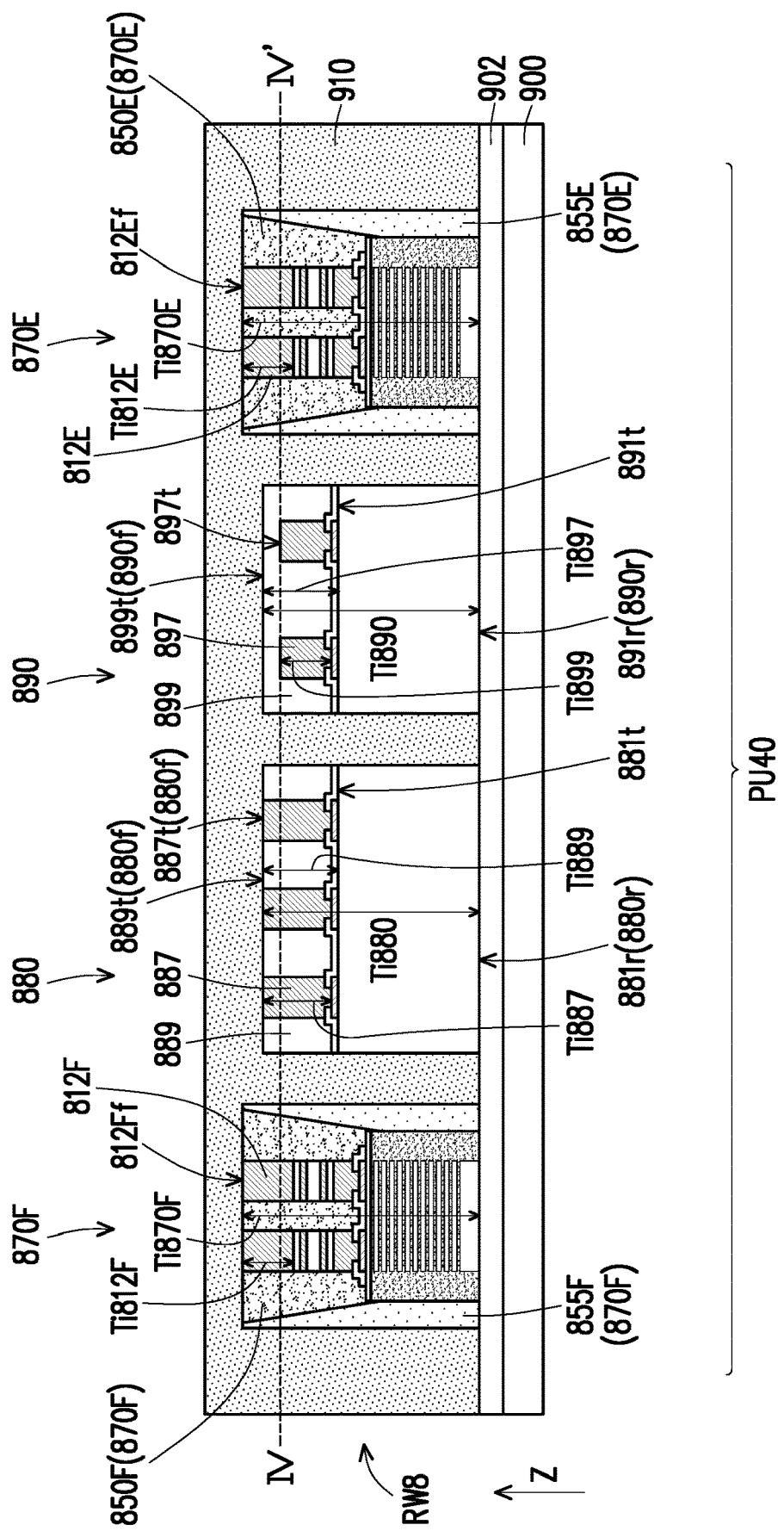

In FIG. 6E, one or more molded dies 870, and one or more semiconductor dies 880, 890 are disposed on a carrier 900 to form a plurality of package units PU40. The carrier 900 may optionally have a de-bonding layer 902 formed thereon, so that the molded dies 870 and the semiconductor dies 880, 890 may be disposed on the de-bonding layer 902. The semiconductor dies 880, 890 may have similar structures as previously described for the semiconductor dies 210, 220 (illustrated, e.g., in FIG. 3A). In some embodiments, the molded dies 870 are disposed with the underfills 855 facing away from the carrier 800. As in the embodiments previously described, the initial thicknesses Ti870 of the molded dies 870 and the initial thicknesses Ti880, Ti890 of the semiconductor dies 880, 890 may be different from each other. An encapsulant 910 is formed over the carrier 900 to encapsulate the molded dies 870 and the semiconductor dies 880, 890, thus forming a reconstructed wafer RW8. The encapsulant 910 may be initially formed so as to bury the molded dies 870 and the semiconductor dies 880, 890. In some embodiments, the encapsulant 910 includes an organic polymer and fillers. In some embodiments, the organic polymer included in the underfill 850, the encapsulant 855, and the encapsulant 910 may be the same, while the fillers may have different sizes. For example, the fillers included in the underfill 850 may be the smallest, the fillers included in the encapsulant 855 may have an intermediate size, and the fillers included in the encapsulant 910 may be the largest. For example, the fillers of the encapsulant 910 may be up to about 1.5 times as large as the fillers of the encapsulant 855, and up to about 15 times as large as the fillers of the underfill 850, but the disclosure is not limited thereto.

Figure 6F:
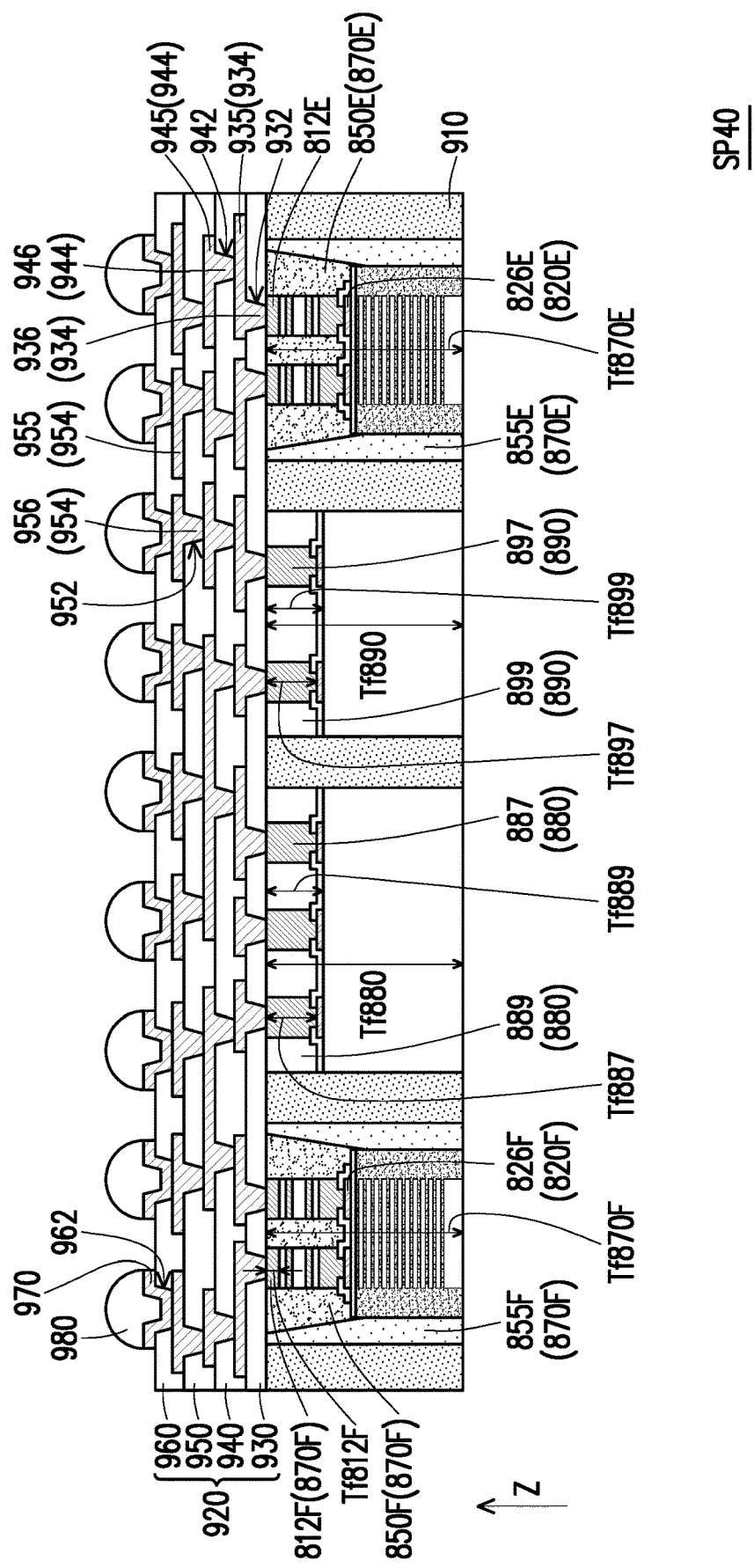

Referring to FIG. 6E and FIG. 6F, a semiconductor package SP40 may be obtained from the structure illustrated in FIG. 6E by performing similar process steps as previously described with reference from FIG. 3B to FIG. 3E. Briefly, the reconstructed wafer RW8 is thinned down to the level height of the cutting plane IV-IV' along the Z direction, until the metal posts 887, 897 of the semiconductor dies 880, 890 and the metal posts 812 of the molded dies 810 are exposed. The thinning of the reconstructed wafer RW8 may be performed through one or more of grinding, chemical-mechanical polishing, or the like.

Together with portions of the encapsulant 910, portions of the molded dies 870 and the semiconductor dies 880, 890 may also be removed. For example, the plane IV-IV' may fall within the vertical span of the metal posts 812, so that the metal posts 812 may be thinned down from initial thicknesses Ti812 to final thicknesses Tf812. That is, the initial thicknesses Ti870 of the molded dies 870 may be reduced to final thicknesses Tf870 by removing material from the side of the front surfaces 812f of the metal posts 812. In some embodiments, portions of the underfills 850 and the encapsulants 855 are also removed together with the portions of the metal posts 812. However, the disclosure is not limited thereto, and, in some alternative embodiments, a cutting plane at the level height described in FIG. 4D and FIG. 4E may be selected.

Furthermore, the cutting plane IV-IV' may fall anywhere within the vertical span of the metal posts 887 and 897, so that, upon thinning of the reconstructed wafer RW8, the metal posts 887, 897 are exposed. Portions of the metal posts 887, 897 and of the protective layers 889, 899 may be removed during thinning of the reconstructed wafer RW8, so that the initial thicknesses Ti887, Ti897 of the metal posts 887, 897 may be reduced to the final thicknesses Tf887, Tf897, and the initial thicknesses Ti889, Ti899 of the protective layers 889, 899 may be reduced to the final thicknesses Tf889, Tf899. As in the previous embodiments, the thicknesses Ti887, Tf887, Ti897, Tf897 of the metal posts 887, 897 are measured as the (vertical) distance from the front surfaces 880f, 890f to the corresponding conductive pads 883, 893, and the thicknesses Ti889, Tf889, Ti899, Tf899 of the protective layers 889, 899 are measured as the (vertical) distance from the front surfaces 880f, 890f to the top surfaces 881t, 891t of the corresponding semiconductor substrates 881, 891. That is, the semiconductor dies 880, 890 may be thinned to final thicknesses Tf880, Tf890 from the initial thicknesses Ti880, Ti890 by removing materials from the side of the front surfaces 880f, 890f.

After thinning of the reconstructed wafer RW8, the redistribution structure 920 is formed on the encapsulated molded dies 870 and semiconductor dies 880, 890, following similar processes as previously described with reference to FIG. 3D. Briefly, the dielectric layers 930, 940, 950, 960 and the redistribution conductive layers 934, 944, 954 are formed alternately stacked. The redistribution conductive layers 934, 944, 954 include routing traces 935, 945, 955 and routing vias 936, 946, 956 extending within the openings 932, 942, 952 of the dielectric layers 930, 940, 950. In some embodiments, the bottommost dielectric layer 930 extends on the encapsulant 910 in which the molded dies 870 and the semiconductor dies 880, 890 are encapsulated, contacting, for example, the protective layers 889, 899 of the semiconductor dies 880, 890 and the underfill 850 of the molded dies 870. Depending on the cuts performed to singulate the molded dies 870 at the stage illustrated in FIG. 6D, the dielectric layer 930 may also contact the encapsulant 855. In some embodiments, under-bump metallurgies 970 may be formed in the openings 962 of the topmost dielectric layer 960. The connective terminals 980 are formed in correspondence of the openings 962 (on the under-bump metallurgies 970, if included), to contact the topmost redistribution conductive layer 754. The semiconductor package SP40 may be obtained by singulation of the reconstructed wafer RW8.

In light of the present disclosure, when manufacturing a semiconductor package, a reconstructed wafer including a plurality of dies may be formed. In some embodiments, issues which may be encountered because of a broad distribution of the initial thicknesses of dies to be included in the reconstructed wafer may be at least partially alleviated by performing a preliminary molding process following which the distribution of the thicknesses of the dies is narrowed. The preliminary molding process may facilitate integration of dies having different structures, such as dies produced through different manufacturing processes, for example, by different manufacturers.

In some embodiments of the present disclosure, a semiconductor package includes a first semiconductor die, a molded die, a third encapsulant, and a redistribution structure. The molded die includes a chip, a first encapsulant, and a second encapsulant. The first encapsulant laterally wraps the chip. The second encapsulant laterally wraps the first encapsulant. The third encapsulant laterally wraps the first semiconductor die and the molded die. The redistribution structure extends on the second encapsulant, the third encapsulant, and the first semiconductor die. The redistribution structure is electrically connected to the first semiconductor die and the molded die. The second encapsulant separates the first encapsulant from the third encapsulant.

In some embodiments of the present disclosure, a semiconductor package includes a first semiconductor die, a second semiconductor die, joint micro-bumps, a second encapsulant, a third encapsulant, a dielectric layer, and a redistribution conductive layer. The first semiconductor die includes a first metal post exposed at a front surface of the first semiconductor die. The second semiconductor die includes stacked chips encapsulated in a first encapsulant. The second semiconductor die includes a contact pad. The joint micro-bumps are disposed on the contact pad of the second semiconductor die. The second encapsulant encapsulates the second semiconductor die and the joint micro-bumps. The third encapsulant encapsulates the first semiconductor die and the second encapsulant. The dielectric layer extends on the third encapsulant and the first semiconductor die and includes openings exposing front surfaces of the first metal post and of the joint micro-bumps. The redistribution conductive layer is disposed on the dielectric layer and extends in the openings of the dielectric layer to contact the front surfaces of the first metal post and of the joint micro-bumps.

In some embodiments of the present disclosure, a manufacturing method of a semiconductor package includes at least the following steps. First semiconductor dies are molded in a first encapsulant to form a first reconstructed wafer. A thickness of the first reconstructed wafer is reduced. The first reconstructed wafer is cut through to obtain first molded dies. The first molded dies include at least one first semiconductor die of the first semiconductor dies. Variations in initial thicknesses of the first semiconductor dies are greater than variations in thicknesses of the first molded dies. The first molded dies and second semiconductor dies are encapsulated in a second encapsulant to form a second reconstructed wafer. A thickness of the second reconstructed wafer is reduced. A redistribution structure is formed on the second reconstructed wafer. The redistribution structure is electrically connected to the first molded dies and the second semiconductor dies.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A semiconductor package, comprising:
a first semiconductor die;
a molded die, comprising:
a chip;
a first encapsulant laterally wrapping the chip; and
a second encapsulant, laterally wrapping the first encapsulant;
a third encapsulant, laterally wrapping the first semiconductor die and the molded die; and
a redistribution structure, extending on the second encapsulant, the third encapsulant, and the first semiconductor die, and electrically connected to the first semiconductor die and the molded die,
wherein the second encapsulant separates the first encapsulant from the third encapsulant.

2. The semiconductor package of claim 1, wherein fillers dispersed in the third encapsulant are larger than fillers dispersed in the second encapsulant.

3. The semiconductor package of claim 2, wherein the third encapsulant and the second encapsulant include a same organic polymer in which the fillers are dispersed.

4. The semiconductor package of claim 1, wherein the molded die comprises a metal post disposed between the chip and the redistribution structure to establish electrical connection between the chip and the redistribution structure.

5. The semiconductor package of claim 4, wherein the metal post is part of a first micro-bump, the molded die comprises a second micro-bump disposed between the first micro-bump and the redistribution structure, the first micro-bump and the second micro-bump are joint to each other by a joint metal layer to form joint micro-bumps, and the joint micro-bumps extend through the second encapsulant to electrically connect the chip to the redistribution structure.

6. The semiconductor package of claim 4, wherein the molded die further comprises an underfill disposed between the chip and the redistribution structure and surrounding the metal post, wherein the second encapsulant laterally wraps the underfill, and fillers dispersed in the underfill are smaller than fillers dispersed in the second encapsulant.

7. The semiconductor package of claim 1, wherein a portion of the second encapsulant extends on a rear surface of the chip.

8. The semiconductor package of claim 1, wherein the chip is one of multiple chips included in the molded die and laterally wrapped by the first encapsulant, wherein the multiple chips include a base chip, a top chip, and chips stacked between the base chip and the top chip, the multiple chips being electrically connected to each other.

9. A semiconductor package, comprising:
a first semiconductor die, comprising a first metal post exposed at a front surface of the first semiconductor die;
a second semiconductor die, comprising stacked chips encapsulated in a first encapsulant, the second semiconductor die comprising a contact pad;
joint micro-bumps disposed on the contact pad of the second semiconductor die;
a second encapsulant, encapsulating the second semiconductor die and the joint micro-bumps;
a third encapsulant, encapsulating the first semiconductor die and the second encapsulant;
a dielectric layer extending on the third encapsulant and the first semiconductor die and comprising openings exposing front surfaces of the first metal post and of the joint micro-bumps; and
a redistribution conductive layer disposed on the dielectric layer, and extending in the openings of the dielectric layer to contact the front surfaces of the first metal post and of the joint micro-bumps.

10. The semiconductor package of claim 9, wherein the joint micro-bumps comprise a second metal post, metal layers, and a third metal post sequentially stacked on the contact pad of the second semiconductor die, and the metal layers include at least one joint metal layer comprising an intermetallic compound.

11. The semiconductor package of claim 9, wherein the dielectric layer further extends on the second encapsulant.

12. The semiconductor package of claim 9, further comprising an underfill surrounding the joint micro-bumps, wherein the dielectric layer further extends on the underfill.

13. The semiconductor package of claim 12, wherein the first semiconductor die comprises a protective layer surrounding the first metal post, and the dielectric layer extends on the protective layer.

14. The semiconductor package of claim 9, further comprising:
　a third semiconductor die, comprising stacked chips encapsulated in a fourth encapsulant, the third semiconductor die comprising another contact pad;
　other joint micro-bumps disposed on the another contact pad of the third semiconductor die; and
　a fifth encapsulant encapsulating the third semiconductor die and the other joint micro-bumps,
　wherein the third encapsulant further encapsulates the fifth encapsulant, and
　a portion of the second encapsulant extending on the second semiconductor die at an opposite side of the second semiconductor die with respect to the joint micro-bumps is thicker than a portion of the fifth encapsulant extending on the third semiconductor die at an opposite side of the third semiconductor die with respect to the other joint micro-bumps.

15. The semiconductor package of claim 14, wherein a first chip of the stacked chips of the second semiconductor die in contact with the portion of the second encapsulant is thinner than a second chip of the stacked chips of the third semiconductor die in contact with the portion of the fifth encapsulant.

16. A manufacturing method of a semiconductor package, comprising:
　providing first semiconductor dies, wherein each first semiconductor die comprises stacked chips, a first encapsulant, and a contact pad, the stacked chips are encapsulated in the first encapsulant, and the contact pad is over the stacked chips;
　forming joint micro-bumps on the contact pads of the first semiconductor dies;
　molding the first semiconductor dies and the joint micro-bumps in a second encapsulant to form a first reconstructed wafer;
　reducing a thickness of the first reconstructed wafer;
　cutting through the first reconstructed wafer to obtain first molded dies, wherein the first molded dies comprise at least one first semiconductor die of the first semiconductor dies, and variations in initial thicknesses of the first semiconductor dies are greater than variations in thicknesses of the first molded dies;
　encapsulating the second encapsulant of the first molded dies and second semiconductor dies in a third encapsulant to form a second reconstructed wafer, wherein each second semiconductor die comprises a metal post exposed at a front surface of the second semiconductor die;
　reducing a thickness of the second reconstructed wafer; and
　forming a redistribution structure on the second reconstructed wafer, the redistribution structure being electrically connected to the first molded dies and the second semiconductor dies, wherein the redistribution structure comprises a dielectric layer and a redistribution conductive layer, the dielectric layer extends on the third encapsulant and the second semiconductor dies, the dielectric layer comprises openings exposing front surfaces of the metal post and of the joint micro-bumps, the redistribution conductive layer is disposed on the dielectric layer and extends in the openings of the dielectric layer to contact the front surfaces of the metal post and of the joint micro-bumps.

17. The manufacturing method of claim 16, wherein forming the joint micro-bumps comprises:
　forming first micro-bumps;
　joining the first semiconductor dies to the first micro-bumps by reflowing together a metal layer of the first micro-bumps to a metal layer of second micro-bumps, wherein the second micro-bumps are located on the conductive pads of the first semiconductor dies.

18. The manufacturing method of claim 17, wherein reducing the thickness of the first reconstructed wafer comprises removing portions of the second encapsulant and portions of the first semiconductor dies from a side of the first semiconductor dies opposite with respect to the first micro-bumps.

19. The manufacturing method of claim 17, wherein reducing the thickness of the first reconstructed wafer comprises removing portions of the second encapsulant leaving rear surfaces of the first semiconductor dies buried within the withdrawn second encapsulant.

20. The manufacturing method of claim 17, wherein reducing a thickness of the second reconstructed wafer comprises removing the first micro-bumps while leaving at least a portion of the second micro-bumps.

* * * * *